US010374118B2

(12) United States Patent
Alloatti et al.

(10) Patent No.: US 10,374,118 B2
(45) Date of Patent: Aug. 6, 2019

(54) SILICON GERMANIUM PHOTODETECTOR APPARATUS AND OTHER SEMICONDUCTOR DEVICES INCLUDING CURVED-SHAPE SILICON GERMANIUM STRUCTURES

(71) Applicant: Massachusetts Institute of Technology, Cambridge, MA (US)

(72) Inventors: Luca Alloatti, Staefa (CH); Rajeev Jagga Ram, Arlington, MA (US); Dinis Cheian, Brooklyn, NY (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/332,877

(22) Filed: Oct. 24, 2016

(65) Prior Publication Data

US 2017/0040487 A1 Feb. 9, 2017

Related U.S. Application Data

(63) Continuation of application No. PCT/US2016/040491, filed on Jun. 30, 2016.

(Continued)

(51) Int. Cl.
*H01L 27/14* (2006.01)
*H01L 31/18* (2006.01)

(Continued)

(52) U.S. Cl.
CPC ...... *H01L 31/1812* (2013.01); *G02B 6/12004* (2013.01); *G02B 6/29338* (2013.01);

(Continued)

(58) Field of Classification Search
CPC ........................ H01L 31/1812; G02B 6/12004

(Continued)

(56) References Cited

U.S. PATENT DOCUMENTS

| | | | |
|---|---|---|---|
| 4,096,512 | A | 6/1978 | Polinsky |
| 4,933,021 | A | 6/1990 | Swanson |

(Continued)

OTHER PUBLICATIONS

"Investigation of the SiGe Waveguide Photodiodes Using FDTD Method for High Speed Optical Communication," The Simulation Standard, 3 pages (2010). https://www.silvaco.com/tech_lib_TCAD/ . . . /2010/apr . . . /april_may_june_a1.pdf.

(Continued)

*Primary Examiner* — Caleb E Henry
(74) *Attorney, Agent, or Firm* — Smith Baluch LLP

(57) ABSTRACT

Semiconductor devices, such as photonics devices, employ substantially curved-shaped Silicon-Germanium (SiGe) structures and are fabricated using zero-change CMOS fabrication process technologies. In one example, a closed-loop resonator waveguide-coupled photodetector includes a silicon resonator structure formed in a silicon substrate, interdigitated n-doped well-implant regions and p-doped well-implant regions forming multiple silicon p-n junctions around the silicon resonator structure, and a closed-loop SiGe photocarrier generation region formed in a pocket within the interdigitated n-doped and p-doped well implant regions. The closed-loop SiGe region is located so as to substantially overlap with an optical mode of radiation when present in the silicon resonator structure, and traverses the multiple silicon p-n junctions around the silicon resonator structure. Electric fields arising from the respective p-n silicon junctions significantly facilitate a flow of the generated photocarriers between electric contact regions of the photodetector.

22 Claims, 29 Drawing Sheets

Related U.S. Application Data

(60) Provisional application No. 62/186,433, filed on Jun. 30, 2015.

(51) Int. Cl.

| | |
|---|---|
| ***G02B 6/12*** | (2006.01) |
| ***G02B 6/293*** | (2006.01) |
| ***H01L 31/0224*** | (2006.01) |
| ***H01L 31/0232*** | (2014.01) |
| ***H01L 31/0312*** | (2006.01) |
| ***H01L 31/0352*** | (2006.01) |
| ***H01L 31/11*** | (2006.01) |
| ***H01L 31/103*** | (2006.01) |

(52) U.S. Cl.
CPC .... *H01L 31/0232* (2013.01); *H01L 31/02327* (2013.01); *H01L 31/022408* (2013.01); *H01L 31/0312* (2013.01); *H01L 31/03529* (2013.01); *H01L 31/103* (2013.01); *H01L 31/1037* (2013.01); *H01L 31/1105* (2013.01); *G02B 2006/12123* (2013.01); *Y02E 10/50* (2013.01)

(58) Field of Classification Search
USPC .................................................... 257/431, 40
See application file for complete search history.

(56) References Cited

U.S. PATENT DOCUMENTS

| | | | | |
|---|---|---|---|---|
| 5,107,319 | A | 4/1992 | Lauterbach et al. | |
| 5,525,828 | A | 6/1996 | Bassous et al. | |
| 6,858,912 | B2 | 2/2005 | Marshall | |
| 6,873,021 | B1 | 3/2005 | Mitros et al. | |
| 7,420,207 | B2 | 9/2008 | Kim et al. | |
| 7,449,712 | B2 | 11/2008 | Cha | |
| 7,539,418 | B1 | 5/2009 | Krishnamoorthy et al. | |
| 7,639,104 | B1 * | 12/2009 | Quevy | H03H 3/0076 333/186 |
| 7,672,558 | B2 | 3/2010 | Keyser | |
| 7,751,655 | B2 | 7/2010 | Fattal et al. | |
| 8,519,806 | B2 * | 8/2013 | Casset | H03H 3/0076 310/312 |
| 9,176,241 | B2 | 11/2015 | Frach | |
| 2002/0109153 | A1 * | 8/2002 | Ker | H01L 27/0251 257/199 |
| 2004/0160658 | A1 * | 8/2004 | Liu | G02F 1/025 359/279 |
| 2008/0272395 | A1 * | 11/2008 | Banna | H01L 29/0843 257/190 |
| 2011/0012693 | A1 * | 1/2011 | Casset | H03H 3/0076 333/186 |
| 2011/0037133 | A1 * | 2/2011 | Su | H01L 31/035281 257/432 |
| 2011/0044362 | A1 | 2/2011 | Wada et al. | |
| 2011/0089518 | A1 | 4/2011 | Murshid | |
| 2012/0255599 | A1 | 10/2012 | Xu et al. | |
| 2013/0015760 | A1 | 1/2013 | Chakraborty et al. | |
| 2013/0224952 | A1 * | 8/2013 | Chang | H01L 29/7845 438/682 |
| 2014/0193115 | A1 | 7/2014 | Popovic | |
| 2016/0171149 | A1 * | 6/2016 | Alloatti | G06F 17/5081 716/52 |
| 2017/0040469 | A1 * | 2/2017 | Alloatti | H01L 31/103 |

OTHER PUBLICATIONS

Georgas, et al., "A Monolithically-Integrated Optical Transmitter and Receiver in a Zero Change 45nm SOI Process," 2014 Symposium on VLSI Circuits Digest of Technical Papers (Jul. 21, 2014), p. 1, col. 1, 2 pages.

International Search Report and Written Opinion dated Mar. 16, 2017 for International Application No. PCT/U52016/039741.

International Search Report and Written Opinion issued by the International Searching Authority in regards to International Application No. PCT/US2016/040491, dated Nov. 4, 2016, 17 pages.

* cited by examiner

SILICON GERMANIUM PHOTODETECTOR APPARATUS AND OTHER SEMICONDUCTOR DEVICES INCLUDING CURVED-SHAPE SILICON GERMANIUM STRUCTURES

CROSS-REFERENCE TO RELATED APPLICATION(S)

This application is a continuation of International Application PCT/US2016/040491, entitled "Closed-Loop Resonator Silicon Germanium Photodetector Apparatus And Other Semiconductor Devices Including Curved-Shape Silicon Germanium Structures," and filed on Jun. 30, 2016, which claims a priority benefit to U.S. provisional application Ser. No. 62/186,433, entitled "Silicon-Germanium Photodiode in Zero-Change Advanced CMOS," and filed on Jun. 30, 2015, which application is hereby incorporated by reference herein.

GOVERNMENT SUPPORT

This invention was made with Government support under Contract No. HR0011-11-C-0100 awarded by the Defense Advanced Research Projects Agency. The Government has certain rights in the invention.

BACKGROUND

Semiconductor electronic devices are made in foundries, of which there are over a hundred worldwide (operated by approximately two dozen or so semiconductor companies adopting a foundry model). Fabrication of large-scale integrated semiconductor electronic devices requires multiple process steps and mask layers that define etching and deposition patterns (e.g., for photoresists), dopant implants, and metallization. A semiconductor foundry may employ a particular set of process steps and mask layers for a given semiconductor device, and process steps/mask layers can differ significantly for different types of semiconductor devices (as well as similar devices made by different foundries). A particular set of process steps and mask layers employed by a given foundry to fabricate any of a variety of semiconductor devices is generally referred to as a "semiconductor manufacturing process technology" (or simply "semiconductor technology"). For fabrication of silicon-based Complimentary-Metal-Oxide-Semiconductor (CMOS) devices, different manufacturing process technologies are sometimes commonly referred to as "CMOS technology nodes." Some common examples of conventional CMOS technology nodes include a 45-nm silicon-on-insulator (SOI) process technology available from IBM (i.e., the IBM SOI12S0 45-nm technology), as well as the IBM SOI13S0 32 nm technology and the IBM 10LPE technology.

For each different semiconductor technology, a set of "design rules" is provided that includes a series of parameters specifying certain geometric and connectivity restrictions for manufacturing semiconductor devices. Such design rules are based on the available process steps and mask layers in a particular semiconductor technology, and provide sufficient margins to account for variability in the process steps used in the technology. Thus, design rules define allowed semiconductor design patterns to be converted to mask designs for the physical layout of a device in a given semiconductor technology. The specification of such technology-dependent design rules ensures reasonably predictable and sufficiently high yields for semiconductor device manufacturing using the given semiconductor technology (e.g., billions of nanoscale components can be fabricated simultaneously with high yield and performance).

Some examples of common design rules employed in a variety of conventional semiconductor technologies include "single layer rules" that specify geometric restrictions and/or restrictions on various connection between elements on a given layer of a multi-layer semiconductor design. Examples of single layer rules include a "minimum size rule" that defines one or more minimum dimensions of any feature or object in a given layer of the design (e.g., a "width rule" that specifies the minimum width, in a plane parallel to the semiconductor substrate, of a feature or object in the design), and a "minimum spacing rule" that specifies a minimum distance between two adjacent features/objects in a given layer. Other examples of single layer rules relate to polygon-shaped elements, and include minimum/maximum area and allowed orientations of polygon edges. Other types of conventional design rules include "two layer rules" (specifying certain relationships that must exist between two layers, such as distance, extension or overlap between two or more layers). Design rule sets have become increasingly more complex with successive generations of semiconductor technologies.

One area of developing research in computing relates to monolithic integration of million-to-billion-transistor circuits with photonic components as an enabling technology for high performance computers (HPC). Generally speaking, "photonic components" refer to various devices employed for light (or photon) generation or emission, transmission or propagation, modulation (e.g., signal processing, switching, filtering, wavelength and/or mode selectivity, amplification), and detection. Optical processing techniques enabled by photonic components can accelerate computation in HPCs by performing processor-intensive tasks at significantly faster rates and with a significant reduction in energy consumption as compared to purely electronic processing techniques. Accordingly, the integration of photonic components and electronic components for computing and other applications is an active area of research endeavor.

In connection with photonic detection devices (referred to generally as "photodetectors"), some such devices may be realized in silicon-based fabrication technologies (e.g., in which photonic detection is based on mid band gap absorption in doped or poly-crystalline silicon waveguides, or by internal photoemission absorption using Schottky junctions). Other investigated approaches for design and fabrication of photodetectors rely on the incorporation of pure germanium on silicon, in which the germanium facilitates photocarrier generation in response to incident photons impinging on the photodetector. However, germanium and other specialized materials, processes and/or geometries that are particularly useful for fabrication of photonics components generally are not readily available in conventional semiconductor manufacturing process technologies employed in advanced electronic foundries. For example, one limited demonstration of integrating germanium photonic components with electronic components involved a modified CMOS technology flow based on 90 nm or older CMOS nodes; however, these CMOS technology nodes already are obsolete for building HPC microprocessors. Moreover, the modifications required of conventional semiconductor technologies to accommodate photonic components generally involve costly process development that in turn creates challenges in maintaining fabrication yield.

SUMMARY

The present disclosure relates generally to the design and fabrication of photonic components using existing conventional semiconductor manufacturing process technologies, i.e., without requiring any modifications to the semiconductor technology and without violating design rules associated with the semiconductor technology. For purposes of the present disclosure, such approaches for designing and fabricating photonic components is referred to as "zero-change photonics" (e.g., if the semiconductor technology employed is a CMOS technology, the design and fabrication of photonic devices according to the principles set forth herein may be referred to as "zero-change CMOS photonics"). In this "zero-change" approach, by relying on well-established and reliably high-yield semiconductor technologies for fabrication of integrated electronics, such electronic circuits may be further effectively integrated with photonics components at the complexity level of microprocessors without altering process flows and/or affecting fabrication yield.

Some earlier fabrication attempts based on zero-change photonics have involved discrete photonic components such as vertically-coupled (vertically-illuminated) photodetectors, grating couplers and optical transmitters. In one of the Applicant's own earlier fabrications, the Applicant demonstrated the fabrication of grating couplers within the 45-nm 12S01 silicon-on-insulator CMOS node of IBM. The resulting grating couplers work well by achieving waveguide propagation losses of less than 5 dB/cm in the wavelength range of 1170 nm-1250 nm. The Applicant also fabricated and tested an optical transmitter comprising a modulator and a driver that achieves 5 Gbps of transmission speed with 70 fJ of transmission energy. However, previous work, including the Applicant's own, on the integration of photodetectors within a conventional CMOS node focused exclusively on surface illuminated devices. In addition, nearly all of the previous work has relied on absorption of light by crystalline silicon and has been restricted to operating wavelengths below 850 nm. An exception is the demonstration of a surface illuminated photodetector at 850 nm that used a SiGe layer within an IBM bipolar transistor (BiCMOS) process.

In view of the foregoing, various embodiments disclosed herein relate to inventive waveguide-coupled silicon-germanium (SiGe) photodetectors and fabrication methods for same. The Applicant has recognized and appreciated that although earlier efforts relating to zero-change photonics have demonstrated the ability to fabricate surface illuminated photodetectors using conventional semiconductor technologies, various advantages in device layout flexibility, integration, and efficiency may be realized via the incorporation of waveguide structures. More specifically, zero-change waveguide-coupled photodetectors employing SiGe to enhance photocarrier generation provide higher performing devices with high yield, and further provide for effective integration of these devices with electronic circuitry.

In one exemplary embodiment, an inventive waveguide-coupled SiGe photodetector is fabricated on a silicon substrate or a silicon-on-insulator (SOI) structure. The SiGe photodetector includes a polysilicon "rib" structure to define a waveguide for guiding light. Additionally, a SiGe region (also referred to as a "pocket") is formed in the substrate, adjacent to and substantially along a length of the polysilicon rib. In operation, an optical mode of radiation propagating in the waveguide formed by the polysilicon rib substantially overlaps with the SiGe pocket to generate photocarriers within the SiGe pocket. The SiGe pocket is further fabricated so as to overlap with a p-n silicon junction, which is formed by placing an n-doped well-implant region and a p-doped well-implant region adjacent to each other in the silicon substrate (and contiguous with the SiGe pocket). An electric field associated with this p-n junction and present in the SiGe pocket facilitates an enhanced flow of the generated photocarriers in the SiGe pocket, thereby more efficiently generating an electric signal in response to the optical mode of radiation in the waveguide.

In sum, one inventive example is directed to a photodetector apparatus, comprising: a silicon substrate; an n-doped well-implant region formed in the silicon substrate; a p-doped well-implant region formed in the silicon substrate and contiguous with the n-doped well-implant region so as to form a p-n junction between the p-doped well-implant region and the n-doped well-implant region; and a Silicon Germanium (SiGe) region formed within both the n-doped well-implant region and the p-doped well-implant region such that the p-n junction is contiguous with the SiGe region.

Another inventive example is directed to a waveguide-coupled Silicon Germanium (SiGe) photodetector apparatus, comprising: a silicon substrate; a p-n silicon junction formed in the silicon substrate by an n-doped silicon region and a p-doped silicon region; a polysilicon (p-Si) rib formed on the silicon substrate to provide a waveguide core for an optical mode of radiation; and a Silicon Germanium (SiGe) pocket formed in the silicon substrate along a length of the polysilicon rib and contiguous with the p-n silicon junction, wherein the SiGe pocket is disposed with respect to the polysilicon rib such that the optical mode of radiation, when present, substantially overlaps with the SiGe pocket to generate photocarriers in the SiGe pocket.

Another inventive example is directed to a zero-change silicon-on-insulator (SOI) CMOS waveguide-coupled Silicon Germanium (SiGe) photodetector apparatus, comprising: a silicon substrate; an n-doped well-implant region formed in the silicon substrate; a p-doped well-implant region formed in the silicon substrate and contiguous with the n-doped well-implant region so as to form a p-n junction between the p-doped well-implant region and the n-doped well-implant region; a polysilicon (p-Si) rib formed on the silicon substrate to provide a waveguide core for an optical mode of radiation; a Silicon Germanium (SiGe) region formed in the silicon substrate along a length of the polysilicon rib and within both the n-doped well-implant region and the p-doped well-implant region such that the p-n junction is contiguous with the SiGe region; a p-doped contact region formed in the p-doped well-implant region such that the p-doped contact region is not contiguous with the SiGe region; an n-doped contact region formed in the n-doped well-implant region such that the n-doped contact region is not contiguous with the SiGe region; a first silicide electric contact region formed in the n-doped contact region; and a second silicide electric contact region formed in the p-doped contact region, wherein: a first p-Si boundary of the p-Si rib is substantially aligned with a first SiGe boundary of the SiGe region; a first n-doped contact region boundary of the n-doped contact region is not aligned with a second p-Si boundary of the p-Si rib; the SiGe region is disposed with respect to the p-Si rib such that the optical mode of radiation, when present, substantially overlaps with the SiGe region to generate photocarriers in the SiGe region; and the SiGe region is disposed with respect to the p-n junction such that an electric field arising from the p-n silicon junction significantly facilitates a flow of the generated photocarriers between the first silicide electric contact region and the second silicide electric contact region.

Another inventive example is directed to a photodetector fabrication method, comprising: A) using a zero-change Complimentary Metal-Oxide Semiconductor (CMOS) fabrication process technology to form a waveguide-coupled photodetector having a Silicon-Germanium (SiGe) photocarrier generation region, an n-doped silicon well-implant region, and a p-doped silicon well-implant region. In one implementation, the zero-change CMOS fabrication process technology is a 45 nanometer 12SOI silicon-on-insulator (SOI) CMOS process technology. In other examples, A) comprises: A1) forming the n-doped silicon well-implant region in a silicon substrate using a conventional n-well layer of the CMOS fabrication process technology; A2) forming the p-doped silicon well-implant region in the silicon substrate, and contiguous with the n-doped silicon well-implant region, using a conventional p-well layer of the CMOS fabrication process technology so as to form a p-n junction between the p-doped silicon well-implant region and the n-doped silicon well-implant region; A3) forming a pocket in the silicon substrate, wherein the pocket is bounded by both the p-doped silicon well-implant region and the n-doped silicon well-implant region; and A4) epitaxially growing the SiGe photocarrier generation region in the pocket, using a conventional PFET strain engineering layer of the CMOS fabrication process technology, such that the p-n junction is contiguous with the SiGe photocarrier generation region.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are more detailed descriptions of various concepts related to, and embodiments of, inventive waveguide-coupled silicon-germanium (SiGe) photodetectors, and fabrication methods for same. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 1:
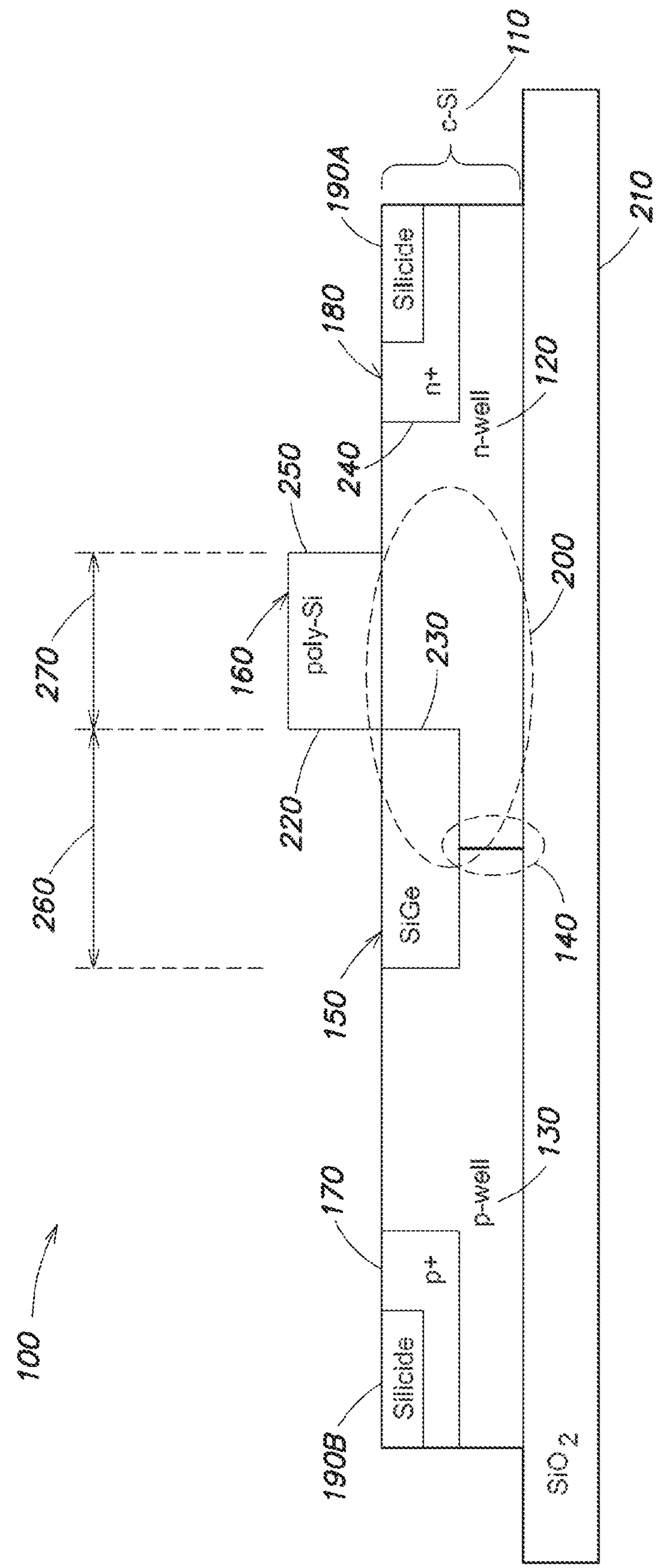
FIG. 1 is a cross-sectional view of a silicon germanium (SiGe) photodetector apparatus, according to one inventive embodiment.

FIG. 1 is a cross-sectional view of a silicon germanium (SiGe) photodetector apparatus 100, according to one embodiment of the invention. As illustrated in FIG. 1, the apparatus 100 includes a silicon substrate 110 (e.g., crystalline silicon, or "c-Si"), in and on which various elements are fabricated pursuant to a semiconductor fabrication process described in further detail below. In some implementations, the silicon substrate 110 is part of a silicon-on-insulator (SOI) structure including silicon dioxide ($SiO_2$) layer 210, which structure is commonly employed in conventional CMOS manufacturing process technologies as discussed further below.

In the embodiment of FIG. 1, the apparatus 100 further includes an n-doped well-implant region 120 formed in the substrate 110, and a p-doped well-implant region 130 also formed in the substrate 110. The n-doped well-implant region and the p-doped well-implant are formed in the substrate to be contiguous with one another so as to form a p-n silicon junction 140 between the respective well-implant regions 120 and 130. The apparatus 100 further comprises a silicon germanium (SiGe) region 150, formed within both the n-doped well-implant region 120 and the p-doped well-implant region 130, such that the p-n silicon junction 140 is contiguous with the SiGe region 150. In one aspect as discussed further below, as a result of selective etching of the well-implant regions 120 and 130 so as to form a pocket therein, and heteroepitaxial growth of silicon germanium in the etched pocket, the SiGe region 150 formed in the respective well-implant regions 120 and 130 also is referred to herein as a "SiGe pocket."

As also shown in the cross-sectional view of FIG. 1, the apparatus 100 further comprises a polysilicon (p-Si) region 160 formed on the silicon substrate 110 to provide a waveguide core for an optical mode of radiation 200 (the optical mode of radiation is shown in FIG. 1 as a roughly oval-shaped region with a dashed-line perimeter). As discussed further below in connection with FIG. 2 (which provides a top view of the apparatus 100), the polysilicon region 160 is formed as a "rib" on the silicon substrate to provide a substantially linear optical path corresponding to the waveguide core, along which the optical mode of radiation 200 propagates (i.e., into or out of the page in the cross-sectional view of FIG. 1). While the polysilicon rib 160 is shown in FIG. 1 as disposed over the n-doped well-implant region 120 (e.g., to the right of the SiGe pocket 150 shown in FIG. 1), it should be appreciated that in other embodiments discussed elsewhere herein, the polysilicon rib 160 may be disposed over the p-doped well-implant region 130 (e.g., to the left of the SiGe pocket 150 shown in FIG. 1). In one exemplary non-limiting implementation, a cross-sectional width 270 of the polysilicon rib 160 is on the order of approximately 170 nanometers.

Figure 2:
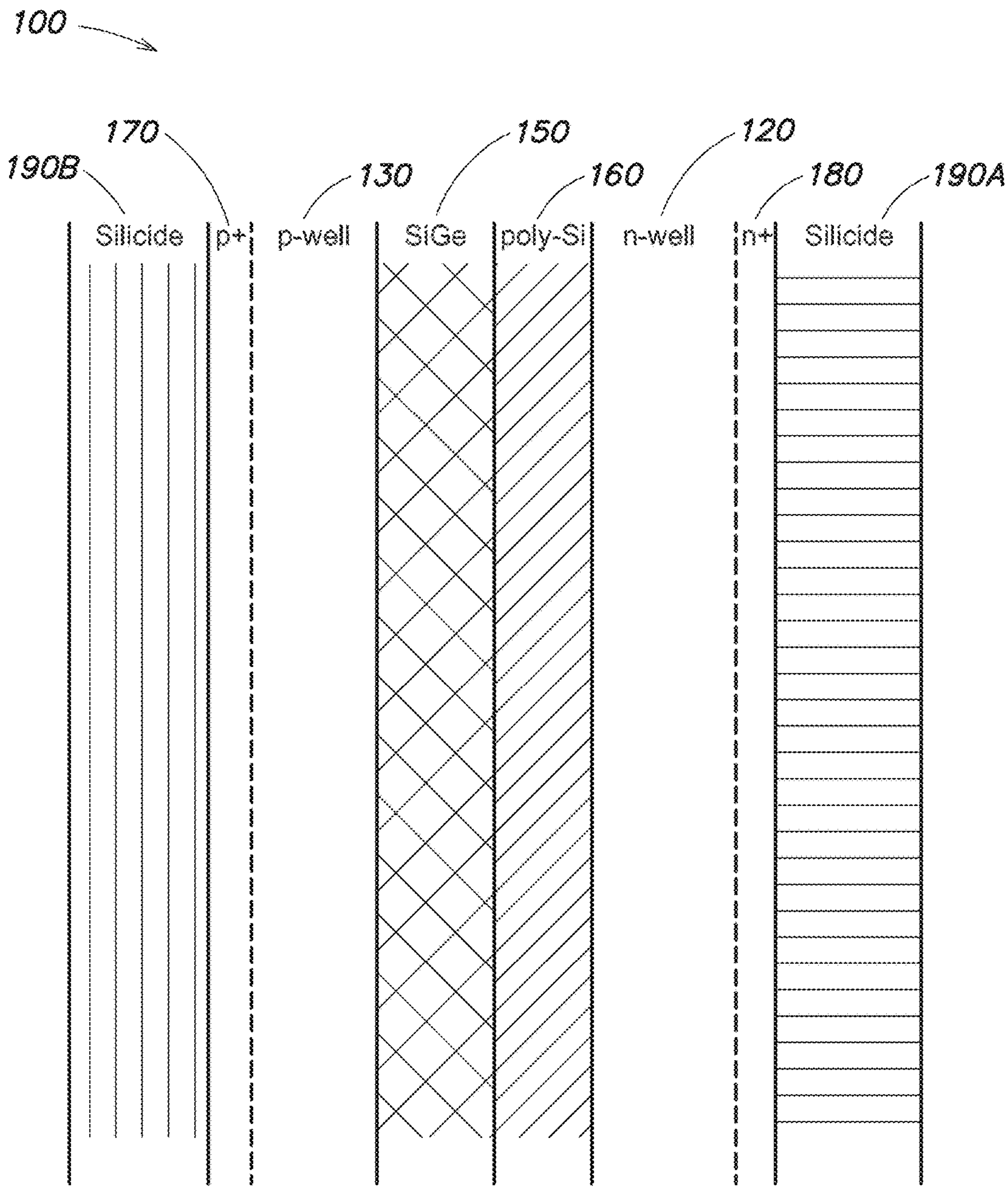
FIG. 2 is a top view of the SiGe photodetector apparatus shown in FIG. 1, according to one inventive embodiment.

As also seen in both FIGS. 1 and 2, the SiGe pocket 150 is formed in the silicon substrate 110 adjacent to (e.g., along a length of) the polysilicon rib 160; in particular, with reference to FIG. 1, a first p-Si boundary 220 of the polysilicon rib 160 (e.g., on the left side of the rib 160 in FIG. 1) is substantially aligned with a first SiGe boundary 230 of the SiGe pocket 150 (e.g., on the right side of the pocket 150 in FIG. 1). In this manner, the SiGe pocket 150 is disposed with respect to the polysilicon rib 160 such that the optical mode of radiation 200, when present, substantially overlaps with the SiGe pocket 150 to generate photocarriers (not shown in FIG. 1) in the SiGe pocket 150.

As noted above, the SiGe pocket 150 shown in FIG. 1 is formed within the well-implant regions 120 and 130 such that the p-n silicon junction 140 is contiguous with the SiGe pocket 150. In one aspect of this embodiment, an electric field arising from the p-n silicon junction 140 significantly facilitates a flow of the photocarriers (generated in the SiGe pocket 150 when the optical mode of radiation 200 is present) toward respective electric contacts of the apparatus 100. To this end, in one exemplary implementation, the SiGe pocket 150 has a cross-sectional width 260, and the p-n silicon junction 140 is substantially aligned with a center of the cross-sectional width 260 of the SiGe pocket 150, as illustrated in FIG. 1, so as to facilitate a greater exposure area of the SiGe pocket to the electric field arising from the p-n silicon junction 140 (and a corresponding field-induced enhanced photocarrier mobility). It should be appreciated, however, that in other embodiments the p-n silicon junction 140 need not necessarily be aligned with the center of the cross-sectional width 260 of the SiGe pocket 150, but need only be contiguous with the SiGe pocket 150 to provide field-induced enhanced mobility for generated photocarriers. In yet another aspect, as discussed in greater detail below, the cross-sectional width 260 of the SiGe pocket is less than or equal to approximately 300 nanometers, so as to mitigate possible material defects in this region (e.g., crystal dislocations) and to better comport with design rules associated with conventional Complimentary Metal-Oxide Semiconductor (CMOS) fabrication manufacturing process technologies. In other aspects, the cross-sectional width 260 may depend on the concentration of Germanium in the SiGe alloy; for example, in some implementations, a relatively smaller width 260 of the SiGe pocket would accommodate a relatively higher Germanium concentration so as to reduce the possibility of crystal dislocations in the SiGe pocket.

Regarding electrical contacts for the apparatus 100 shown in FIG. 1, the apparatus further comprises a p-doped contact region 170 formed in the p-doped well-implant region 130, such that the p-doped contact region 170 is not contiguous with the SiGe pocket 150. More specifically, the p-doped contact region 170 is formed sufficiently away from the polysilicon rib 160 to reduce possible adverse effects (e.g., high optical loss caused by free-carrier absorption) on the optical mode of radiation 200 arising from the more highly doped contact region 170.

Similarly, the apparatus comprises an n-doped contact region 180 formed in the n-doped well-implant region 120 (and similarly not contiguous with the SiGe pocket 150). In one exemplary implementation, the n-doped contact region 180 is formed in the n-doped well-implant region 120 such that a first n-doped contact region boundary 240 (e.g., on the left side of the contact region 180 shown in FIG. 1) is not aligned with a second p-Si boundary 250 of the polysilicon rib 160 (e.g., on the right side of the polysilicon rib 160 shown in FIG. 1). As noted above in connection with the p-doped contact region 170, the sufficient separation between the polysilicon rib 160 and the n-doped contact region 180 reduces possible adverse effects (e.g., high optical loss caused by free-carrier absorption) on the optical mode of radiation 200 arising from the more highly doped contact region 180. FIG. 1 also shows a first electric contact region 190A formed in the n-doped contact region 180, and a second electric contact region 190B formed in the p-doped contact region 170, to provide access points of electric contact for the apparatus 100 (e.g., to facilitate a flow of photocurrent corresponding to the photocarriers generated in the SiGe pocket 150 by the optical mode of radiation 200). In one exemplary implementation, the electric contact regions 190A and 190B may be silicide electric contact regions.

Figure 3:
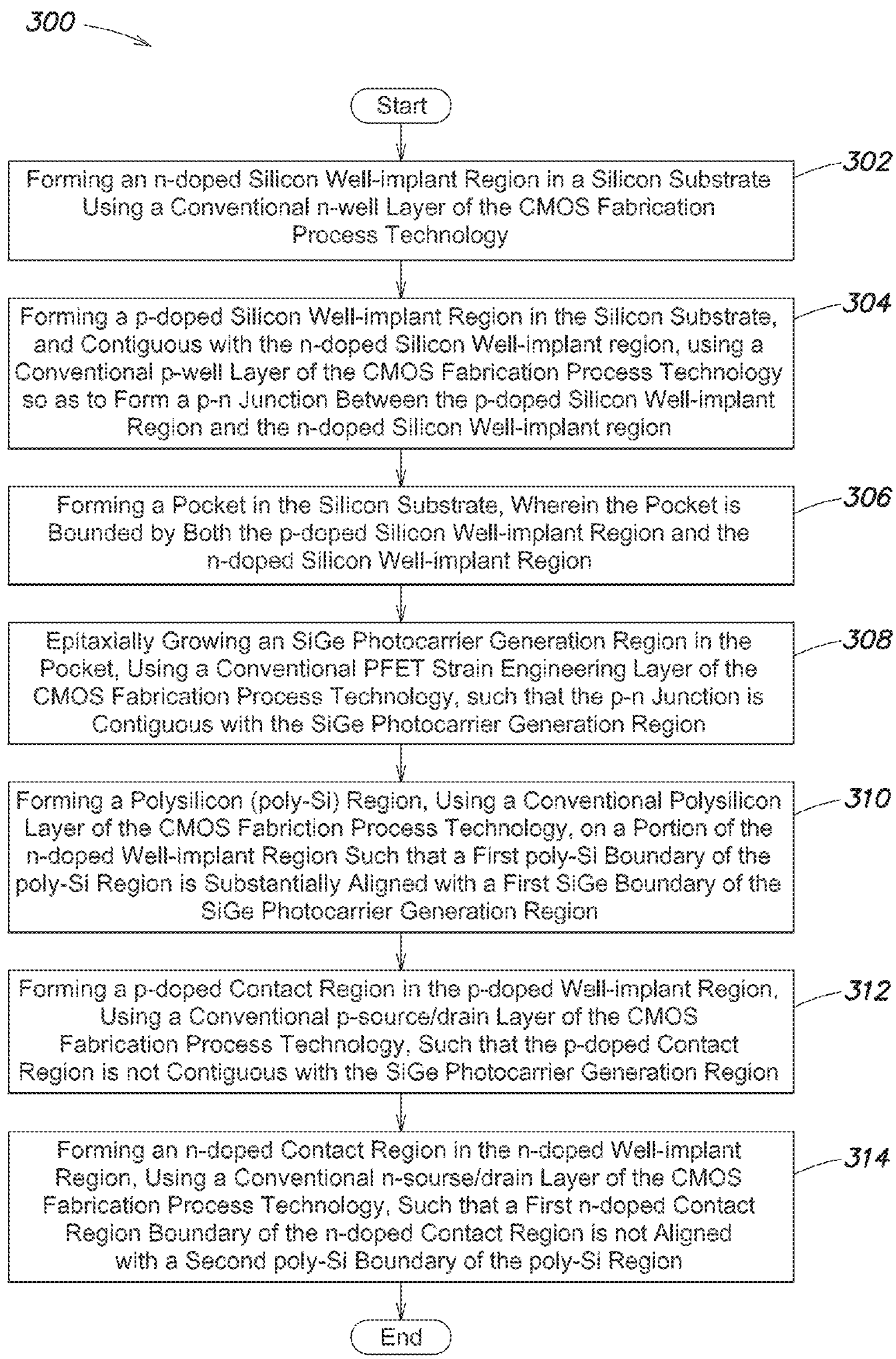
FIG. 3 is a flow chart outlining a fabrication method for the photodetector apparatus of FIGS. 1 and 2, according to one inventive embodiment.

FIG. 3 is a flow chart outlining a fabrication process 300 for the photodetector apparatus of FIGS. 1 and 2, according to one embodiment of the invention. In some embodiments, the process 300 uses a zero-change CMOS fabrication process technology to form a waveguide-coupled photodetector apparatus, similar to that shown in FIGS. 1 and 2, having a SiGe photocarrier generation region (e.g., the SiGe pocket 150), an n-doped silicon well-implant region (e.g., the region 120), and a p-doped silicon well-implant region (e.g., the region 130). An example of such a CMOS fabrication process technology includes, but is not limited to, IBM's 45-nanometer 12SOI silicon-on-insulator (SOI) CMOS node.

In block 302 of the process 300 shown in FIG. 3, an n-doped silicon well-implant region (e.g., the region 120 in FIG. 1) is formed in a silicon substrate using a conventional n-well layer of the CMOS fabrication process technology. In block 304, a p-doped silicon well-implant region (e.g., the region 130 in FIG. 1) is formed in the silicon substrate, and contiguous with the n-doped silicon well-implant region, using a conventional p-well layer of the CMOS fabrication process technology, so as to form a p-n silicon junction between the p-doped silicon well-implant region and the n-doped silicon well-implant region. It should be appreciated that block 302 need not happen before block 304 in various implementations of the process 300. In block 306, a pocket is formed in the silicon substrate, wherein the pocket is bounded by both the p-doped silicon well-implant region and the n-doped silicon well-implant region. In block 308, a SiGe photocarrier generation region (e.g., the region 150 shown in FIG. 1) is epitaxially grown in the pocket, using a conventional PFET strain engineering layer of the CMOS fabrication process technology, such that the p-n silicon junction is contiguous with the SiGe photocarrier generation region. As noted above in connection with FIG. 1, in some implementations a cross-sectional width of the SiGe photocarrier generation region is less than or equal to approximately 300 nanometers, and the pocket may be formed (and the SiGe epitaxially grown) such that the p-n silicon junction is substantially aligned with a center of the cross-sectional width of the SiGe region.

In block 310 of the process 300 shown in FIG. 3, a polysilicon (p-Si) region (e.g., the region 160 shown in FIG. 1) is formed using a conventional polysilicon layer of the CMOS fabrication process technology, such that a first p-Si boundary of the p-Si region is substantially aligned with a first SiGe boundary of the SiGe photocarrier generation region. In block 312, a p-doped contact region (e.g., the region 170 shown in FIG. 1) is formed in the p-doped well-implant region using a conventional p-source/drain layer of the CMOS fabrication process technology, such that the p-doped contact region is not contiguous with the SiGe photocarrier generation region. In block 314, an n-doped contact region (e.g., the region 180 shown in FIG. 1) is formed in the n-doped well-implant region using a conventional n-source/drain layer of the CMOS fabrication process technology, such that the n-doped contact region similarly is not contiguous with the SiGe photocarrier generation region. To this end, in one exemplary implementation, a first n-doped contact region boundary of the n-doped contact region is not aligned with a second p-Si boundary of the p-Si region.

In one exemplary implementation according to the inventive concepts outlined above, a waveguide-coupled photodetector is fabricated in a 45-nm 12SOI semiconductor process technology pursuant to an innovative photonic toolbox within a zero-change CMOS paradigm. One example of such a photonics design toolbox is described in U.S. non-provisional application Ser. No. 14/972,007, filed Dec. 16, 2015, entitled "Methods and Apparatus for Automated Design of Semiconductor Photonic Devices," which application is incorporated by reference herein in its entirety. This implementation differs from previous work on the integration of photodetectors within zero-change CMOS in that the previous work has focused exclusively on surface-illuminated devices, whereas the current work as described herein relates to waveguide-coupled devices. Additionally, nearly all of the previous work has relied on absorption of light by crystalline silicon and has been restricted to $\lambda<850$ nm, with an exception being a surface-illuminated detector at $\lambda=850$ nm that used the SiGe layer within an IBM bipolar transistor (BiCMOS) process. In contrast, the waveguide photodetector according to various inventive embodiments described herein provides an important interface between photonic integrated circuits and CMOS electronic integrated circuits. In different examples, the waveguide-coupled photodetector apparatuses presented herein are responsive at longer wavelengths of radiation that can be guided with low loss through silicon photonic integrated circuits.

Figure 4:
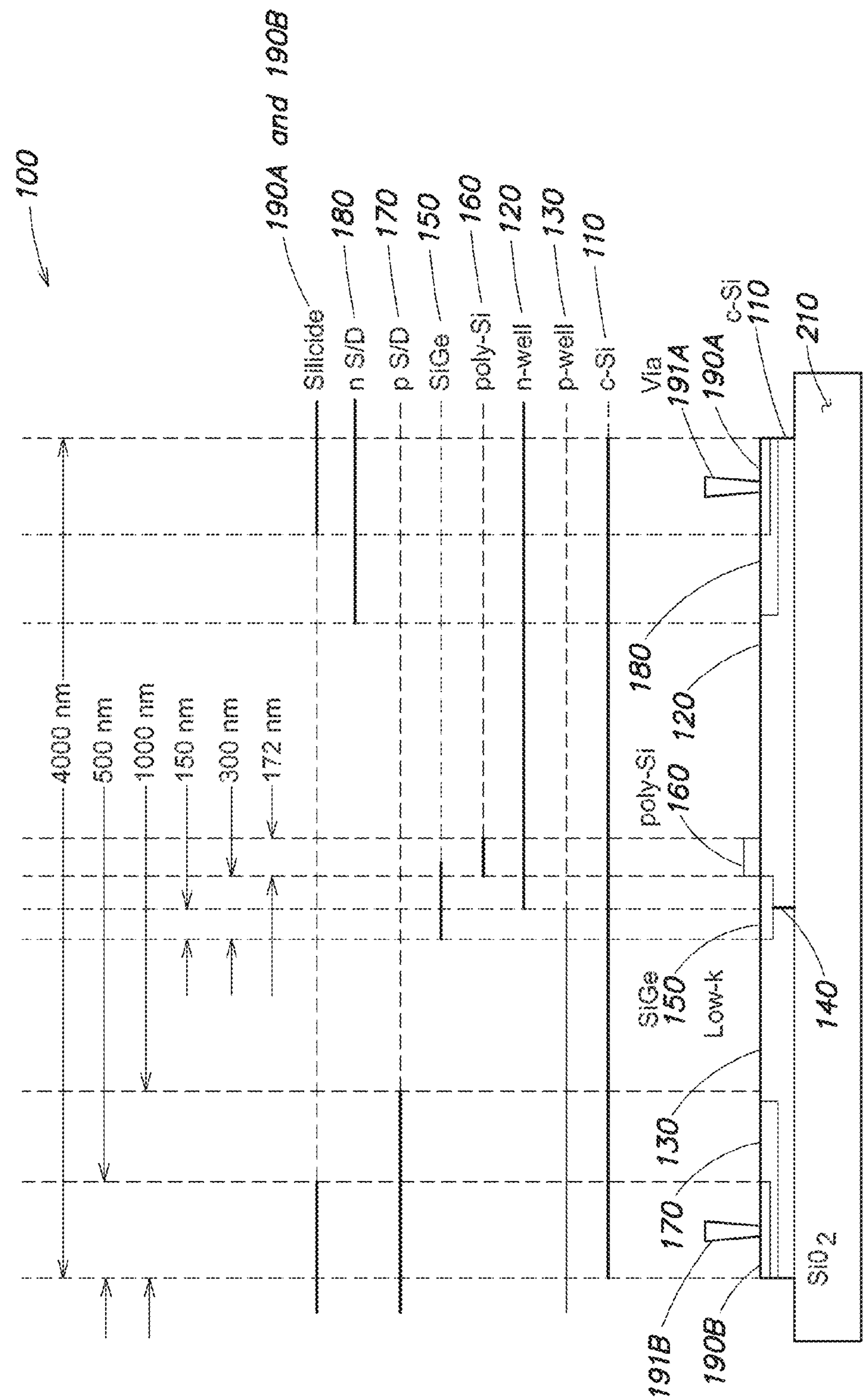
FIG. 4 shows additional fabrication details of an example waveguide-coupled photodetector apparatus similar to that shown in FIG. 1, according to one inventive embodiment.

FIG. 4 shows additional fabrication details (including salient dimensions for respective features) of an example waveguide-coupled photodetector apparatus 100 similar to that shown in FIG. 1, according to one inventive embodiment. In one aspect, as with the photodetector apparatus of FIG. 1, the photodetector apparatus 100 of FIG. 4 is based on carrier generation in the silicon-germanium (SiGe) heteroepitaxially grown in a silicon pocket adjacent to a waveguide. Conventionally, SiGe is utilized in the 12SOI semiconductor process technology for compressively straining pFET channels therefore increasing the hole mobility. However, in the present inventive embodiment, in contrast to conventional uses, SiGe is employed for photocarrier generation, based on its particular physical properties, to enhance photodetector efficiency.

In the photodetector apparatus shown in FIG. 4, on top of the crystalline silicon 110 a 172 nm wide polysilicon strip 160 (normally utilized as transistor gates) defines the waveguide core. A 300 nm wide SiGe pocket 150 is formed next to the polysilicon 160. Two well implants, a n-well 120 and a p-well 130 define a pn-diode whose junction is in the center of the SiGe region 150. The germanium content is estimated to be in the 25 to 35 atomic percent based on data of older nodes. In one aspect, the SiGe may be p-type doped during epitaxy, and is designed sufficiently narrow for avoiding the formation of crystal dislocations. Source/drain implants 170 and 180, silicidation layers 190A and 190B, and metal vias 191A and 191B form the electron/hole collectors and complete the electrical circuit.

Figures 5A, 5B:
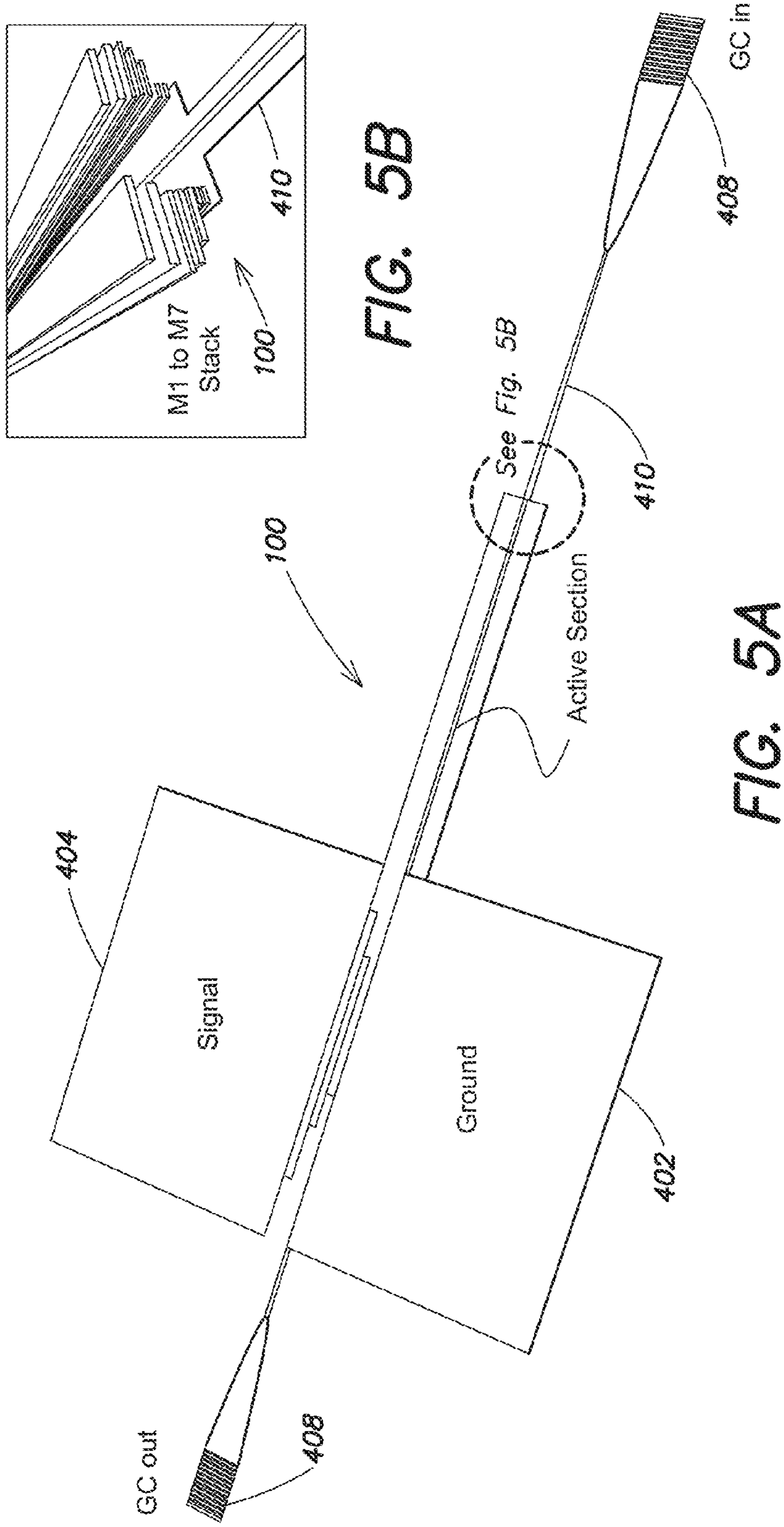
FIG. 5A is a perspective view of the photodetector apparatus of FIG. 4 with a SiGe active region, and ground and signal (GS) electrodes, according to one inventive embodiment.
FIG. 5B is an inset from FIG. 5A showing a close up of the input waveguide and a schematic representation of the multiple-layer fabrication stack of the waveguide-coupled photodetector device, according to one inventive embodiment.

FIG. 5A is a perspective view of the photodetector apparatus of FIG. 4 with a SiGe active region, and ground and signal (GS) electrodes 402 and 404, respectively, according to one inventive embodiment. In particular, as shown in FIG. 5A, ground-signal (GS) high-frequency electrodes with minimal density of metal fill shapes (required by the foundry to minimize dishing of the wafer) are placed parallel to the waveguide-coupled photodetector apparatus 100, which includes a 99.4 μm-long SiGe active region. Also shown in FIG. 5A are the grating couplers GC in 406 and GC out 408 for coupling radiation into and out of the photodetector apparatus. A long input waveguide section 410 is used to couple the GCs 406 and 408 to the active section of the photodetector apparatus 100. FIG. 5B is an inset from FIG. 5A showing a close up of the input waveguide section 410 and a schematic representation of the multiple-layer fabrication stack of the waveguide-coupled photodetector apparatus 100. With respect to the multiple layers shown in FIG. 5B, it should be appreciated that the layers above the first three (i.e., silicon, SiGe and poly-Si) are metal layers and may not all be present in other implementations (e.g., when the photodetector apparatus is connected with an on-chip receiver). The multiple metal layers shown in FIG. 5B relate in part to the notion that the depicted photodetector apparatus is fabricated as an example of a test device with large electrical pads to facilitate testing and characterization. In one exemplary implementation, the apparatus illustrated in FIGS. 4, 5A, and 5B has been designed by a fully-scripted code which forms part of a complete photonic-design automation (PDA) tool based on Cadence, in which the PDA tool provides for abstract photonic layers, automatic DRC-cleaning, and photonic/electronic auto-routing, as set forth in U.S. non-provisional application Ser. No. 14/972,007, incorporated by reference herein as noted above.

Figure 6:
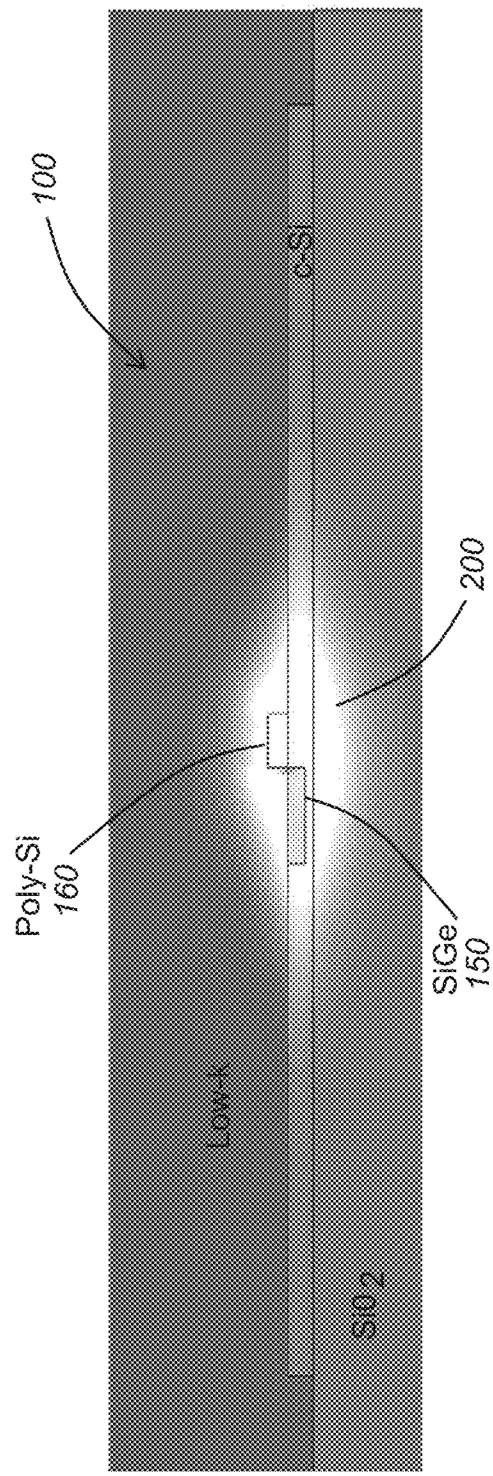
FIG. 6 shows a simulation result of the SiGe photodetector apparatus of FIGS. 4, 5A, and 5B in cross-sectional view, highlighting the overlap region in which the optical mode of radiation propagating through the waveguide overlaps with SiGe active region, according to one inventive embodiment.

FIG. 6 shows the SiGe photodetector apparatus 100 of FIGS. 4, 5A, and 5B in cross-sectional view, highlighting an overlap region in which the optical mode of radiation 200 propagating through the waveguide formed by the polysilicon rib 160 overlaps with SiGe active region 150, according to one inventive embodiment. In particular, FIG. 6 shows the intensity of the TE00 optical mode representing a simulation result of a SiGe photodetector apparatus 100 in cross-sectional view that highlights the overlap of the optical mode 200 and SiGe active region 150.

To demonstrate proof of concept, waveguide-coupled photodetector apparatuses of three different SiGe lengths (1.4 μm, 9.4 μm, and 99.4 μm) have been fabricated, according to the concepts disclosed herein, for characterizing optical loss of the apparatuses (e.g., via the cut-back method). To characterize device performance, each device has been fabricated with both an input and an output grating coupler (as shown, for example, in FIGS. 5A and 5B).

Figure 7:
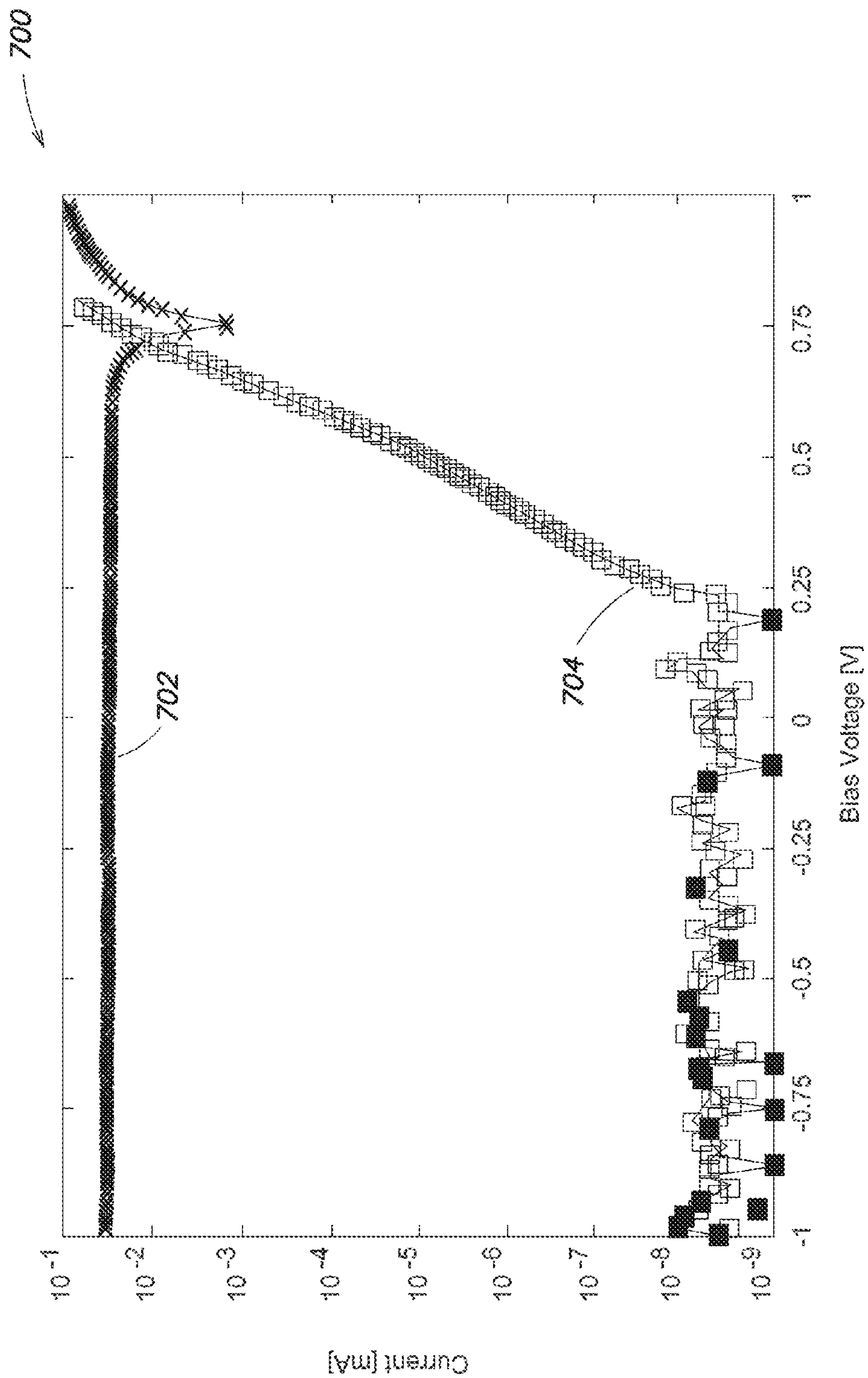
FIG. 7 shows a current-voltage (CV) characteristics of a photodetector apparatus with and without illumination, according to one inventive embodiment.

FIG. 7 shows a graph 700 with respective plots of current-voltage (CV) characteristics of the 99.4 μm long photodetector apparatus, with and without illumination (i.e., the top plot 702 is the CV characteristic with illumination, and the bottom plot 704 is the CV characteristic without illumination). The dark current measured is less than 10 pA resulting in a reverse-bias dynamic range of more than 60 dB.

Figure 8:
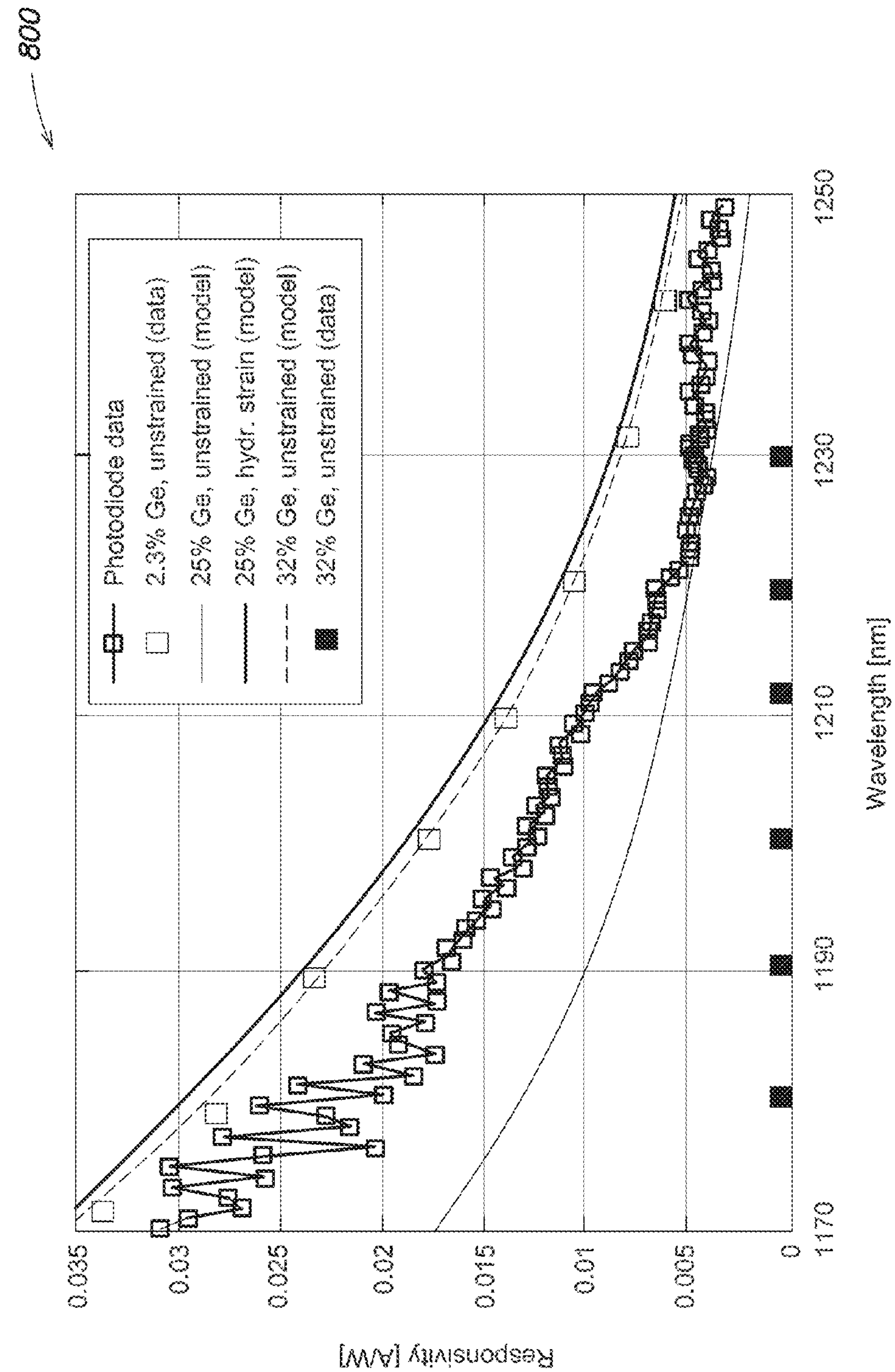
FIG. 8 shows a graph with plots of respective detection responsivities of different SiGe photodetectors as a function of wavelength, λ, according to various inventive embodiments.

FIG. 8 shows a graph 800 with plots of respective detection responsivities of different SiGe photodetector apparatuses as a function of wavelength, λ, according to various inventive embodiments. The responsivity of each device (defined as optical power at the photodetector input/photocurrent) was measured as a function of wavelength by recording at the same time input and output optical power, and photocurrent. The measurement was repeated a second time with exchanged input and output fiber connectors so as to verify that the input and output grating couplers caused the same optical loss. For comparison, FIG. 8 also shows the responsivity based on the optical absorption measured in unstrained SiGe at various germanium concentrations and based on the Macfarlane equations:

$$\alpha(v) = A\left[\frac{(hv - E_g - k\theta)^2}{1 - e^{-\theta/T}} + \frac{(hv - E_g + k\theta)^2}{e^{\theta/T} - 1}\right]$$

where v is the photon frequency, $E_g$ is the energy gap, k is the Boltzmann constant, T=295 K is the room temperature, θ is the phonon energy (expressed in K), and the sum over the six branches of the vibrational spectrum has already been carried out and is contained in the coefficient A. For the bandgap and phonon energy of unstrained SiGe we set $E_g$=1.088 eV, 0.991 eV, and 0.965 eV and θ=550 K, 480 K, and 460.4 K for the concentrations of 0%, 25%, and 32% respectively. The bandgap data and the phonon energy for pure silicon is as reported by R. Braunstein, A. R. Moore, and F. Herman in Physical Review, 109 (3), 695 (1958), incorporated by reference herein. With these values, a good agreement is obtained with the experimental data of unstrained silicon germanium. FIG. 8 also shows that the effects of hydrostatic strain on 25% germanium are taken into account by shrinking the bandgap by 0.03 eV, obtaining an upper boundary of the measured responsivity.

Figure 9:
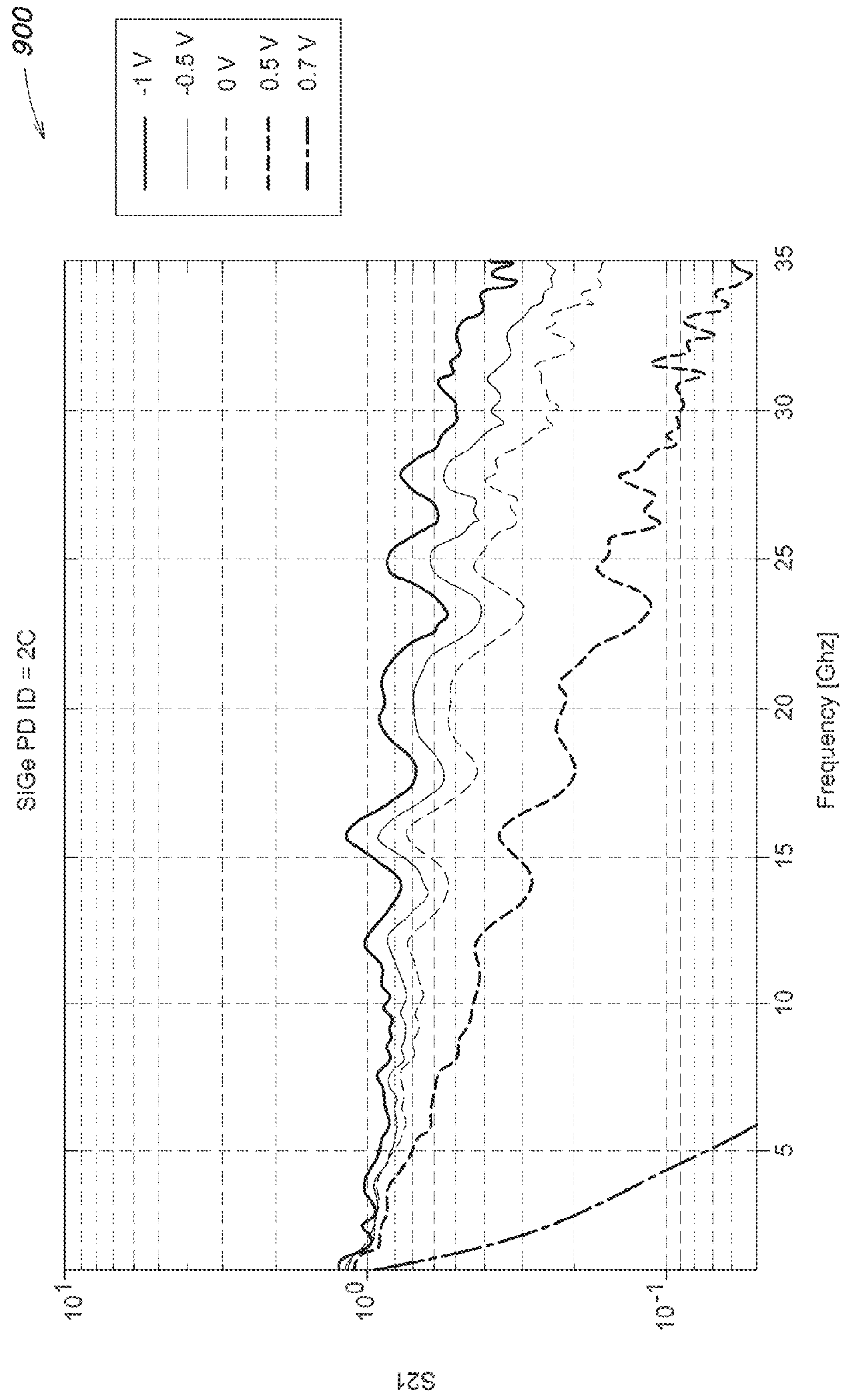
FIG. 9 shows a graph illustrating a responsivity of a SiGe photodetector apparatus, according to one inventive embodiment, via plots of measured electro-optic transmission coefficient at different photodetector bias voltages as a function of frequency, ω.

In addition, the power overlap integral of the optical mode with the SiGe region is calculated to determine the device responsivity based on the absorption coefficient of silicon-germanium. To this end, FIG. 9 shows a graph 900 illustrating a responsivity of a SiGe photodetector apparatus, according to one inventive embodiment, via respective plots of measured electro-optic transmission coefficient at different photodetector bias voltages as a function of frequency, ω. As shown in FIG. 9, the responsivity of the devices are as follows: The overlap integral is found to vary approximately linearly between 0.128 at a wavelength of 1,170 nm and 0.121 at a wavelength of 1,250 nm. At the wavelength of 1,180 nm the responsivity is of 0.023±0.002 A/W (−1V bias). If no other loss mechanism was present, this responsivity would correspond to an optical propagation loss of 10.7 dB/cm. From the cut-back method, the optical loss was found to be 40±10 dB/cm and is dominated by free-carrier absorption (FCA) in the pre-doped poly-silicon. This means that the quantum efficiency of the present geometry can reach at least 20% in the long-device limit. Furthermore, results in a 0.18 μm bulk CMOS node show that the propagation loss of optimized polysilicon waveguides can be as low as 10 dB/cm. Because of the small optical overlap with the polysilicon rib of the current geometry, as shown in FIG. 9, the use of low-loss poly-silicon (in a modified process) would likely lead to parasitic losses below 10 dB/cm and therefore to quantum efficiencies beyond 50% in the long device limit.

The bandwidth of an example waveguide-coupled photodetector apparatus according to one inventive embodiment was measured by contacting the ground-source (GS) electrodes (e.g., see FIG. 4) with a 50 μm pitch GS probe of Cascade Microtech (model Infinity I67-A-GS-50). The reference plane was set at the V-connector of the probe, so that the probe is considered part of the photodiode. The frequency response was measured with a 40 GHz VNA (HP8722D) and the frequency-response of the setup (comprising modulator, semiconductor-amplifier (SOA), RF cables and bias-T) was calibrated with a reference photodiode (Discovery Semiconductors, model DSC30-3-2010) of known frequency-response at a wavelength of 1,550 nm. It was confirmed that the frequency response of the combined system of modulator and reference photodiode is identical (within measurement accuracy) at 1,550 nm and 1,180 nm. Based on the foregoing, the example waveguide-coupled photodetector apparatus has a 3 dB bandwidth of 18 GHz at 0 V bias. The bandwidth increases to 32 GHz with a reverse bias of −1 V. A different set of waveguide-coupled photodetector apparatuses, in which the p-n silicon junction (e.g., see 140 in FIG. 1) was shifted by 150 nm towards the waveguide center (e.g., toward the center of the poly-Si rib 160 in FIG. 1), showed smaller bandwidths (8 GHz at −1 V bias). The generated photocurrent is sufficient for driving an on-chip electrical receiver which has a peak-to-peak sensitivity of 6 μA at 5 Gb/s.

Figure 10:
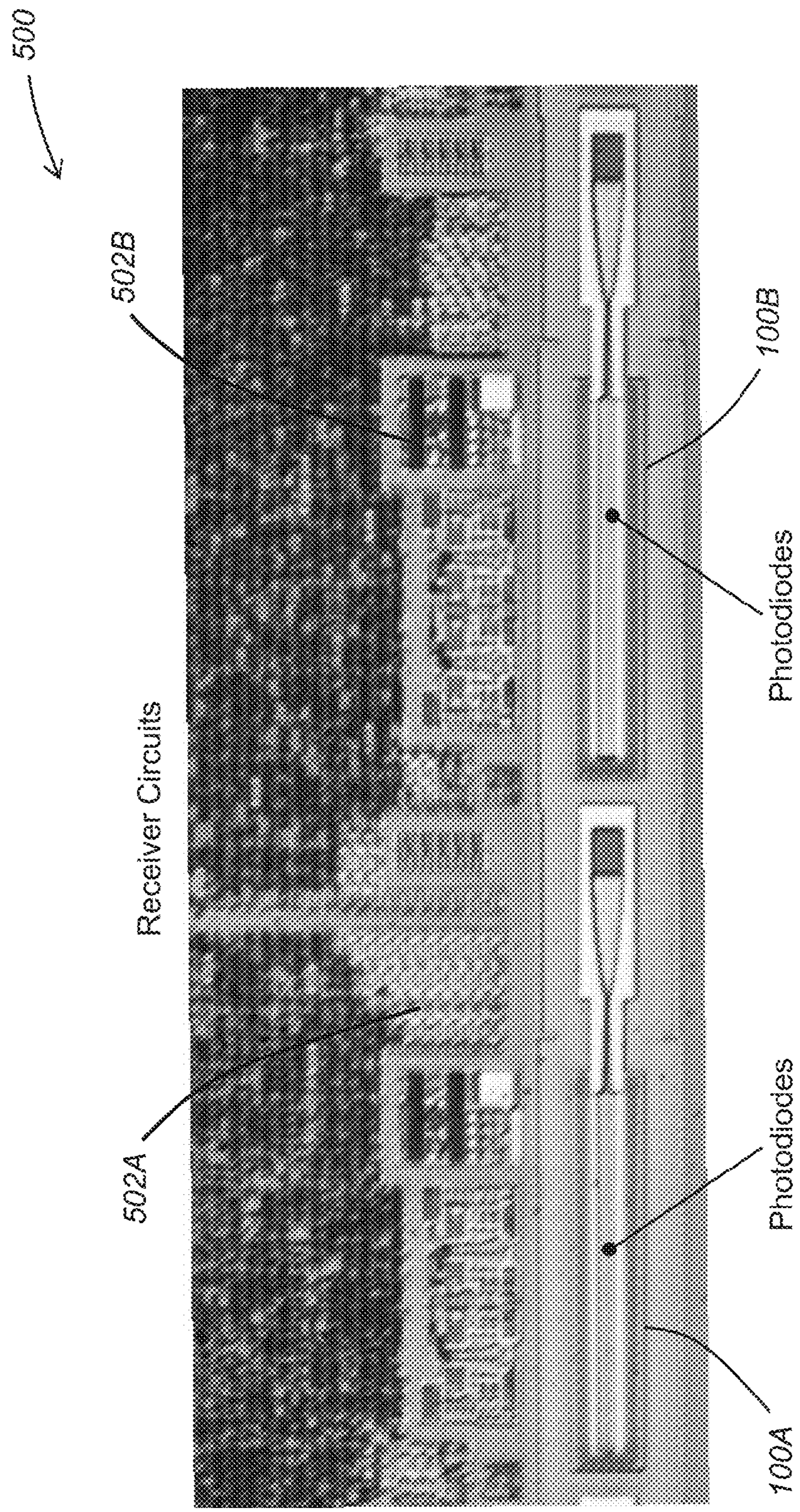
FIG. 10 is a photographic rendering of fabricated photodetector apparatuses monolithically integrated with electronic receiver circuitry, according to one inventive embodiment.

FIG. 10 shows a micrograph 500 of a fabricated device that monolithically integrates two waveguide-coupled photodetector apparatuses 100A and 100B with electric receiver circuitry 502A and 502B, according to one inventive embodiment. Since according to the "zero-change" approach discussed herein no changes to the fabrication flow or to the design rules of the conventional semiconductor technology fabrication process have been made, the yield of the transistors is expected to be unchanged. This paradigm enables fabrication of complex electronic designs with a million transistors or more. The electronic receiver in particular, which contains a much smaller number of gates (=transistors) can be fabricated with almost no effort and with a near 100% yield.

As described herein, fabrication and characterization of a waveguide-coupled photodetector apparatus compatible with unchanged CMOS processes have been demonstrated. Examples of fabricated photodetector apparatuses have a 3 dB bandwidth of 32 GHz at −1 V bias. In one implementation, a waveguide-coupled photodetector apparatus is realized in the 45-nm CMOS node, which is widely used in manufacturing of integrated circuits for high-performance computing (HPC).

In other inventive embodiments, semiconductor and photonics devices are considered that employ curved-shape SiGe regions and other curved-shape semiconductor regions. For purposes of the present disclosure, in some examples curved-shaped semiconductor regions or elements may be achieved in semiconductor fabrication technologies via rectangle discretization of element boundaries (e.g., using only lines at 0 and 90 degree orientations, i.e., "Manhattan geometry") on a significantly smaller scale compared to the overall region or element, so as to effectively approximate and substantially constitute a curved boundary for the region or element on a functional scale. Examples of curved-shaped semiconductor regions or elements include, but are not limited to, curvilinear regions, and various curved closed-loop regions, such as circular regions, ring-shaped regions, ellipsis-shaped regions and racetrack-shaped regions.

One example embodiment employing a curved-shape SiGe region is directed to a waveguide-coupled closed-loop resonator SiGe photodetector apparatus. As discussed in greater detail below, a closed-loop resonator SiGe photodetector includes a silicon resonator structure formed in a silicon substrate, interdigitated n-doped well-implant regions and p-doped well-implant regions forming multiple silicon p-n junctions around the silicon resonator structure, and a closed-loop SiGe photocarrier generation region formed in a pocket within the interdigitated n-doped and p-doped well implant regions. The closed-loop SiGe region is located so as to substantially overlap with an optical mode of radiation when present in the silicon resonator structure, and traverses the multiple silicon p-n junctions around the silicon resonator structure. Electric fields arising from the respective p-n silicon junctions significantly facilitate a flow of the generated photocarriers between electric contact regions of the photodetector. In one implementation, the closed-loop resonator is implemented as a circular ring.

By employing closed-loop resonator structures such as a ring resonator, long effective lengths (for example, much longer than the 100 μm of the straight photodetector as described above) are enabled. This extra effective length of the SiGe photocarrier generation region increases the quantum efficiency of the resonator as compared to linear examples (e.g., typical quality factors Q achieved in all-silicon ring-resonators in the 45-nm 12SOI technology are between 5,000 and 50,000).

Figure 11A:
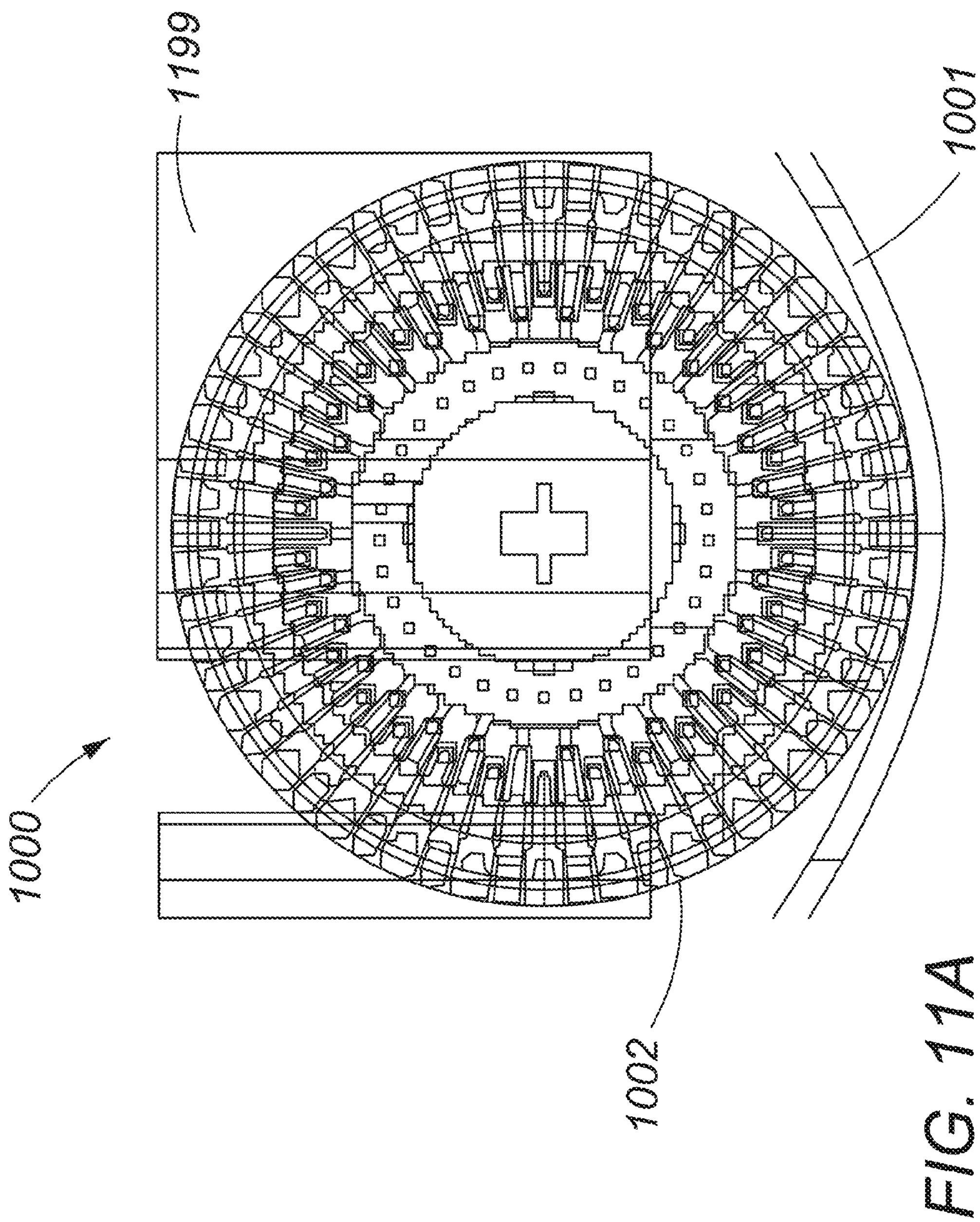
FIGS. 11*a*, 11*b* and 11*c* show different aspects of feature layout for a closed-loop resonator waveguide-coupled photodetector apparatus according to inventive embodiments.
Figure 11B:
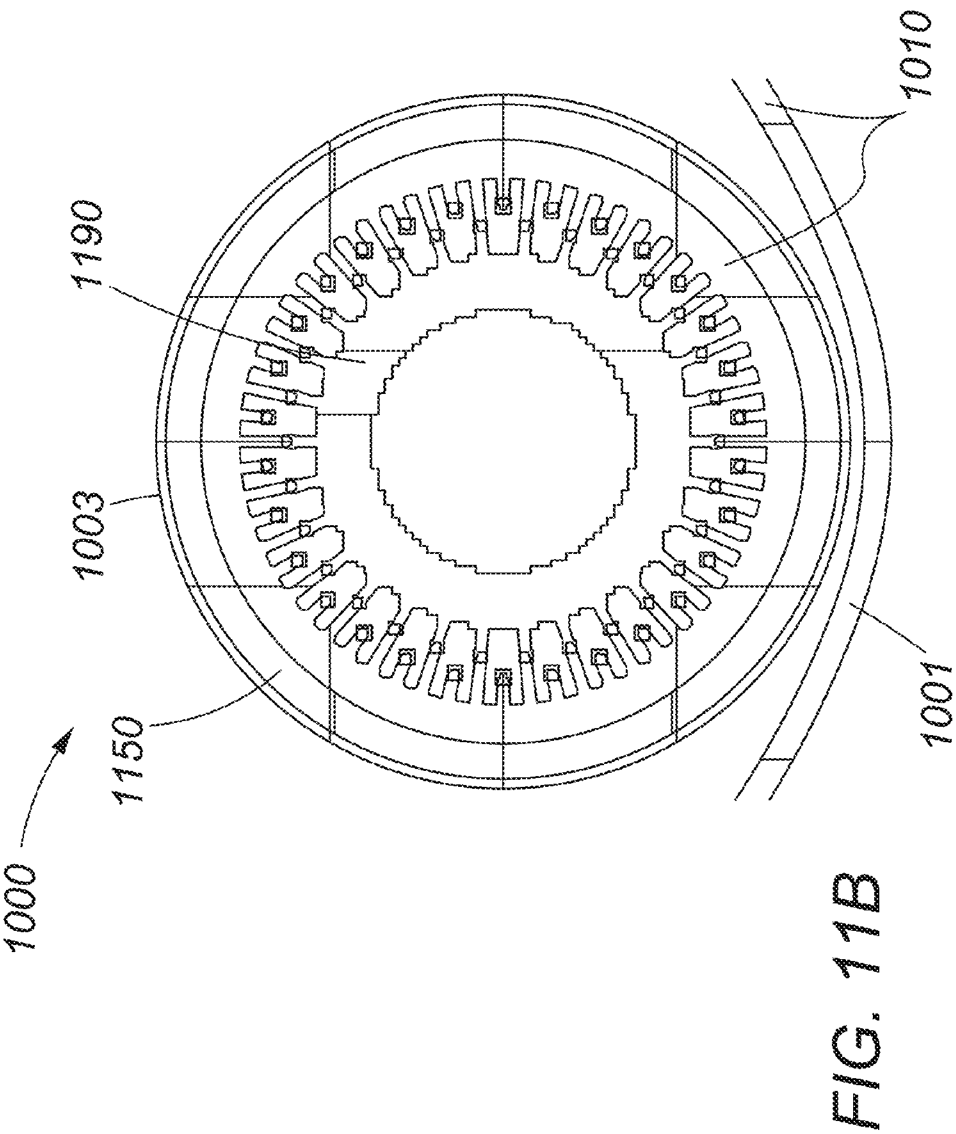
Figure 11C:
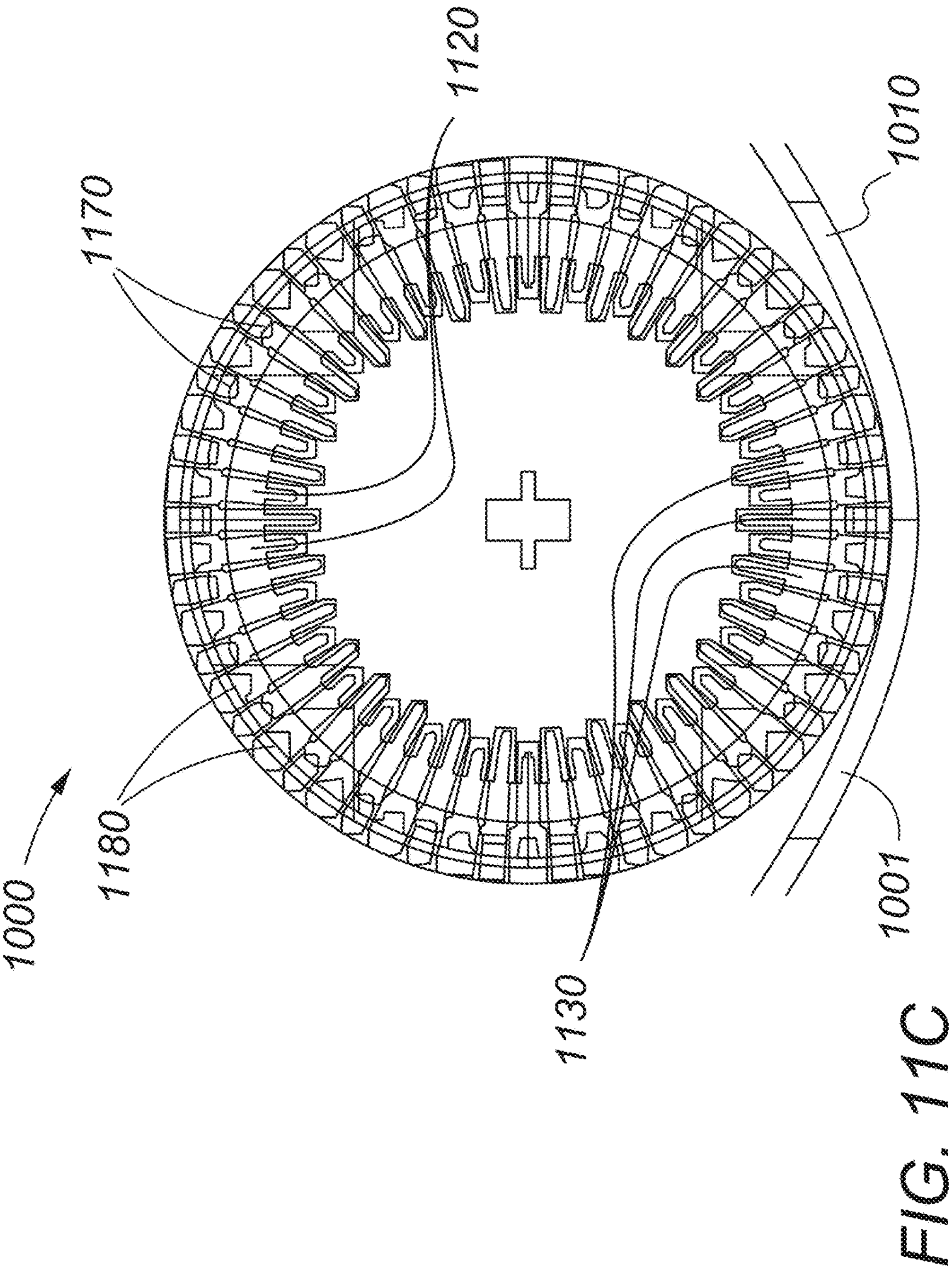

FIGS. 11*a* through 11*c* show various aspects of a feature layout of an exemplary ring-resonator photodetector apparatus according to other inventive embodiments. FIG. 11*a* is a full layout of the ring-resonator photodetector apparatus showing interdigitated metal contacts, doping patterns, vias and top contact pads (some auxiliary layers, vias and metal layers are hidden). FIG. 11*b* shows the silicon resonator structure, a ring-shaped SiGe region within the silicon resonator structure, and one metal layer. Photocarrier generation occurs in the SiGe region, which is located around the intensity peak of a whispering-gallery mode in the resonator. FIG. 11(*c*) shows an interdigitated doping pattern for n-type and p-type well implants constituting "spokes" around the resonator structure.

More specifically, as shown in FIGS. 11*a*-11*c*, an access waveguide 1001 and the ring cavity 1002 of the ring-resonator SiGe photodetector 1000 can be etched into crystalline silicon 1010, which is standard in the 45-nm 12SOI work-flow for fabricating transistors. Similar to the linear resonator approach described above, the ring-resonator photodetector 1000 exploits carrier generation in SiGe layer 1150, which is heteroepitaxially grown in ring-shaped pocket. A signal pad 1199 is shown superimposed on the ring resonator 1000. As described earlier, the germanium content in the SiGe is estimated to be between 25% and 35%. The outer radius of the silicon ring 1003 is 5 μm, and the SiGe region 1150 is 500 nm wide, as shown in FIG. 11*b*. FIG. 11*c* shows two n-type masks for n-implants 1120 and two p-type masks for p-implants 1130, which are used to form interdigitated junctions in the SiGe region 1150. These implants are further used to form spokes which connect electrically the SiGe region 1150 to the contacts 1190 located on the inner radius, as shown in FIG. 11*b*. In some implementations, the SiGe 1150 region may be p-doped during epitaxy, and an extra n-type counter implant may be added on the outer radius for reducing the optical loss due to free-carrier absorption (FCA). Another p-type mask is used with the same purpose over a part of the n-type spokes. Source-drain (S/D) implants and silicidation complete the electrical contact to the vias. As a result of adding counter implants into the doped regions, p-doped with n-type counter implant 1170 and n-doped with p-type counter implant 1180 are created. High-frequency ground-signal (GS) electrodes with minimized metal autofill densities have been used. The access waveguide 1001 is 400 nm wide and follows a cosine trajectory (25 μm wavelength). The disk-like cavity 1002 exploits a whispering gallery mode for effectively separating the optical field from the metal contacts 1190. This type of cavity also may be used for building modulators.

Figure 12A:
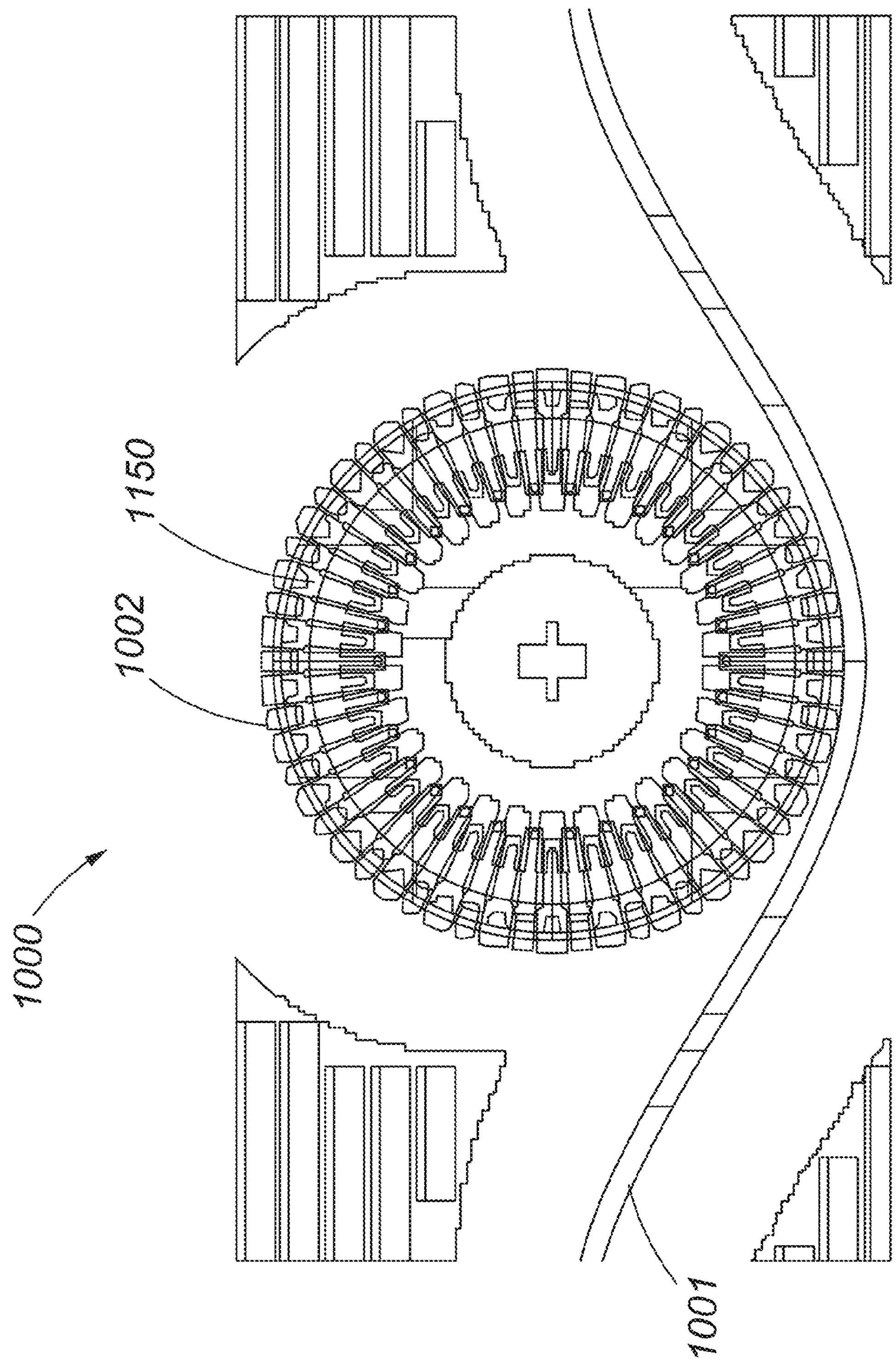
FIG. 12*a* shows another layout view of the waveguide-coupled photodetector apparatus of FIGS. 11*a*, 11*b*, and 11*c* including a ring resonator, an access waveguide, and an inner metal electrode, according to one inventive embodiment.
Figure 12B:
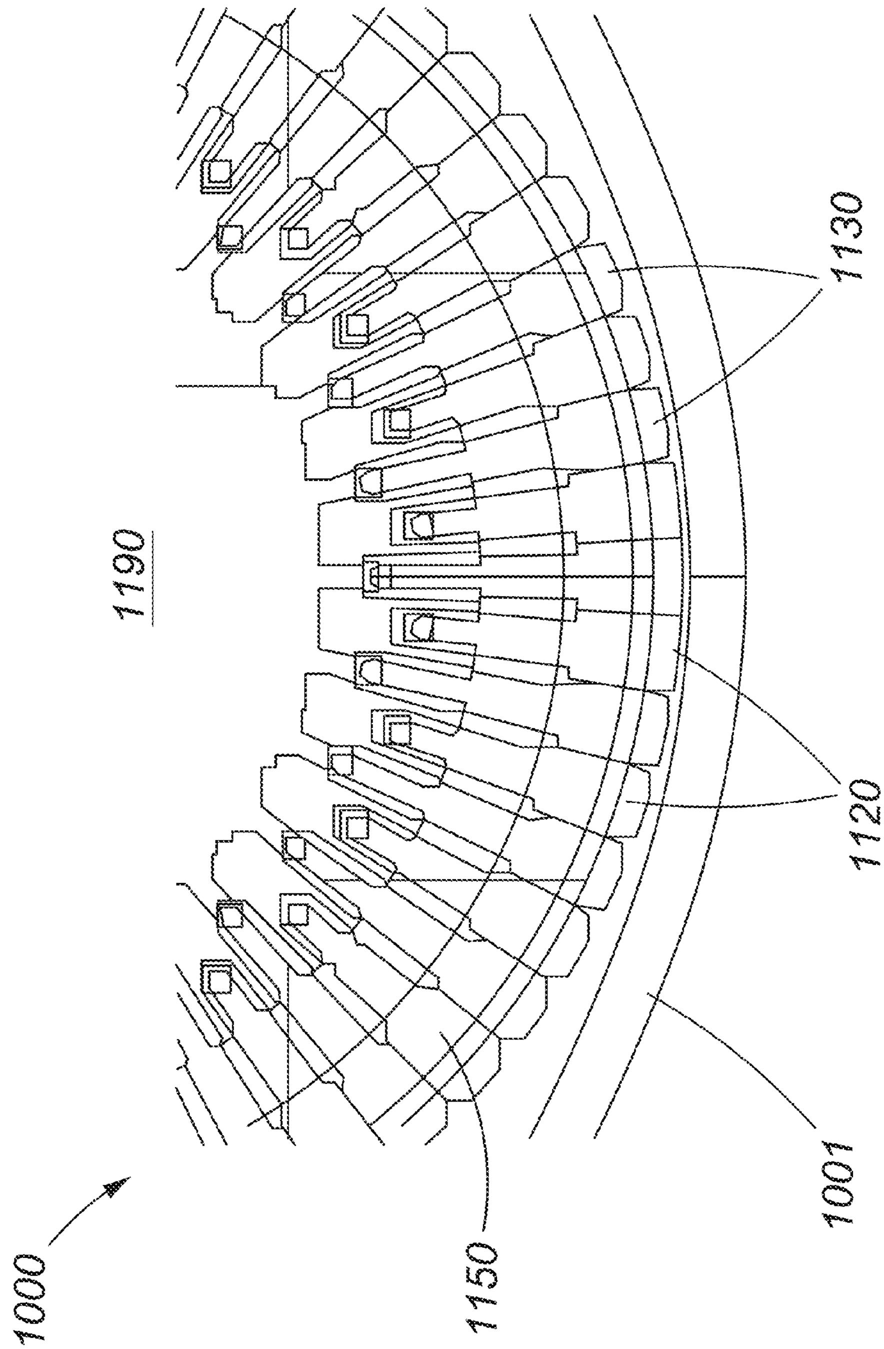
FIG. 12*b* is a zoomed-in view of a bottom portion of the photodetector apparatus of FIG. 12*a*.
Figure 12C:
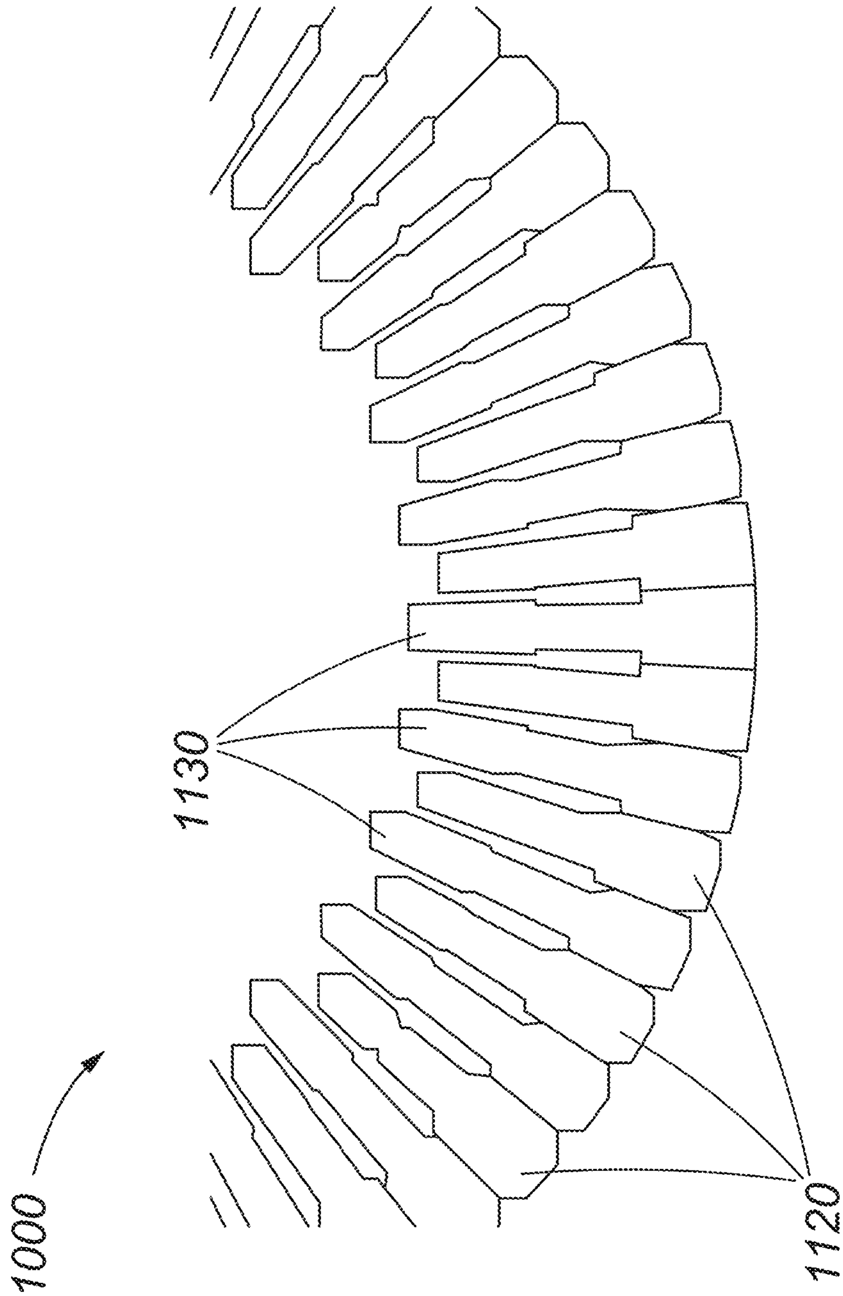
FIG. 12*c* shows interdigitated clove-shaped n-doped well-implants and p-doped well-implants, in the portion of the photodetector apparatus shown in FIG. 12*b*.
Figure 12D:
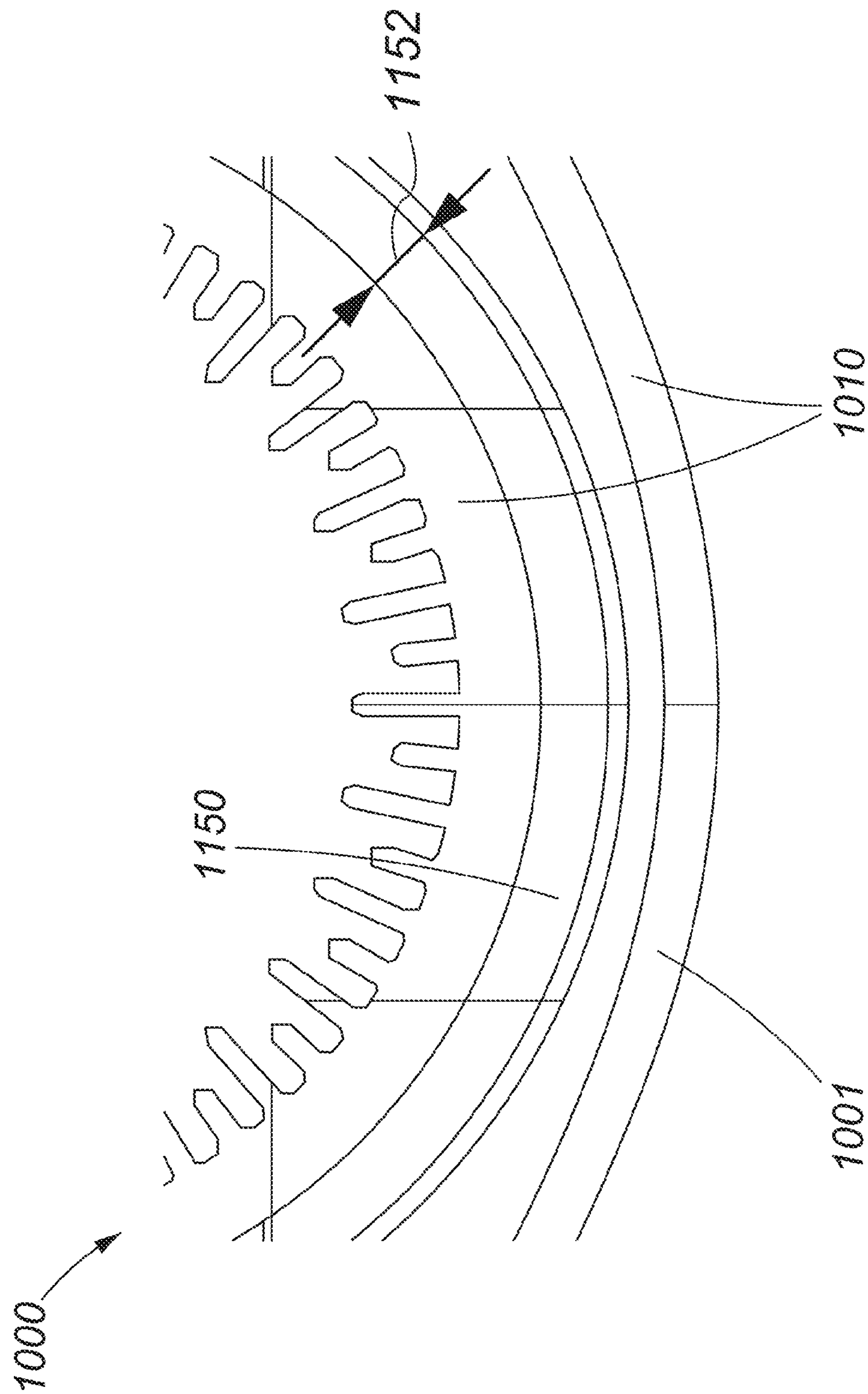
FIG. 12*d* shows a portion of a silicon ring resonator structure, a portion of a curved-shape SiGe region in the silicon ring resonator structure, and a silicon access waveguide, in the portion of the photodetector apparatus shown in FIG. 12*b*.

FIGS. 12*a* through 12*d* provide additional details of the waveguide-coupled closed-loop resonator photodetector apparatus of FIGS. 11*a*, 11*b*, and 11*c*, including a circular silicon-germanium section and interdigitated implants having the shape of cloves for reducing parasitic junction capacitance. FIG. 12*a* shows a full device comprising a ring resonator, an access waveguide, inner metal electrode connecting every second spoke (the second electrode is not shown); FIG. 12*b* is a zoomed-in view of a specific portion of the device to show interconnection between features of the SiGe photodetector; FIG. 12*c* shows a set of well implant masks for the specific portion; and FIG. 12*d* shows the silicon and silicon-germanium layers in the specific portion.

For clarity, FIG. 12*a* shows the resonant SiGe photodetector 1000 of FIGS. 11*a*-11*c* without the contact pad 1199. As shown in the configuration of FIG. 12*a*, the photodetector represents a ring-resonator with a circular silicon-germanium region 1150 located where the optical mode is near the maximum (e.g., at about 300 nm from the outer radius of the ring cavity 1002 for an incident wavelength of 1180 nm). In this example, the ring cavity 1002 has a radius of 5 μm and the silicon-germanium 1150 width is 500 nm. As shown in the FIG. 12*a*, the incident light is coupled resonantly into the ring as described above.

Shown in FIG. 12*b* is a portion of the resonant SiGe photodetector 1000 with a curvilinear SiGe region, formed in interdigitated implant patterns (spokes) which are created as alternating p-n junctions (between 1120 and 1130) to extract the generated photocarriers. Metal electrodes 1190 for cathode and anode connect every second spoke. The p-n junctions form a capacitance C, while the doped silicon regions connecting the junctions to the respective electrodes form a resistance R. The RC time constant is a factor that determines the device bandwidth. In the example in FIG. 12*a*, in order to reduce the parasitic capacitance (for increasing the bandwidth), the doping patterns are created to have the shape of cloves so that they are largest in the proximity of the outer radius (where the majority of the photocarriers is being generated) and narrower for smaller radii towards the base (i.e., the center of the ring cavity 1002). Higher-dose masks (not shown in the picture) can be superimposed in the narrow section of the clove for avoiding depletion in these sections and for reducing the resistance R. Other doping patterns may apply as well, such as the counter-implants discussed in the following section. FIG. 12*c* shows a set of well implant masks for the specific portion and FIG. 12*d* shows the silicon 1010 and silicon-germanium 1150 layers in the specific portion. In one example implementation, the width 1152 of the SiGe 1150 is 500 nm.

Figure 13A:
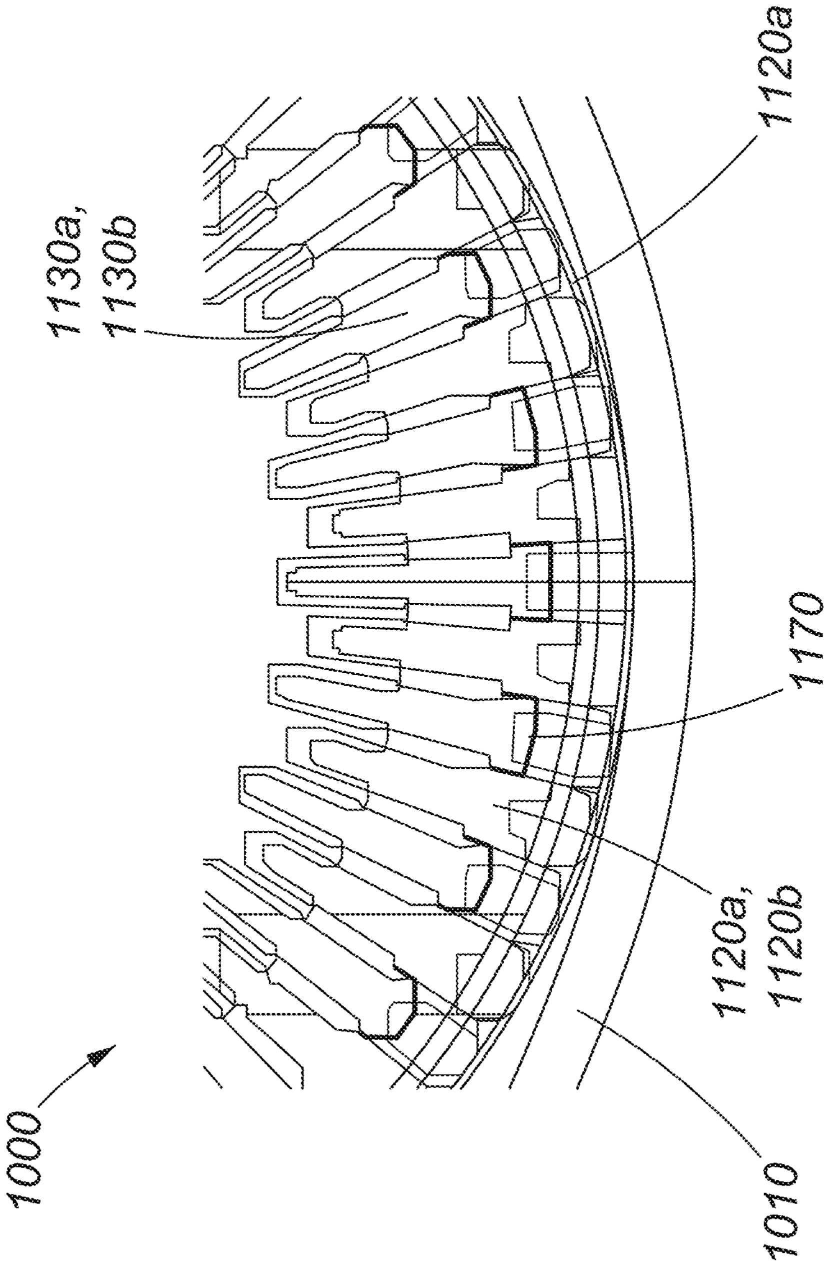
FIG. 13*a* shows multiple doping masks employed for p-type and n-type regions, in the portion of the photodetector apparatus shown in FIG. 12*b*, according to one example embodiment.
Figure 13B:
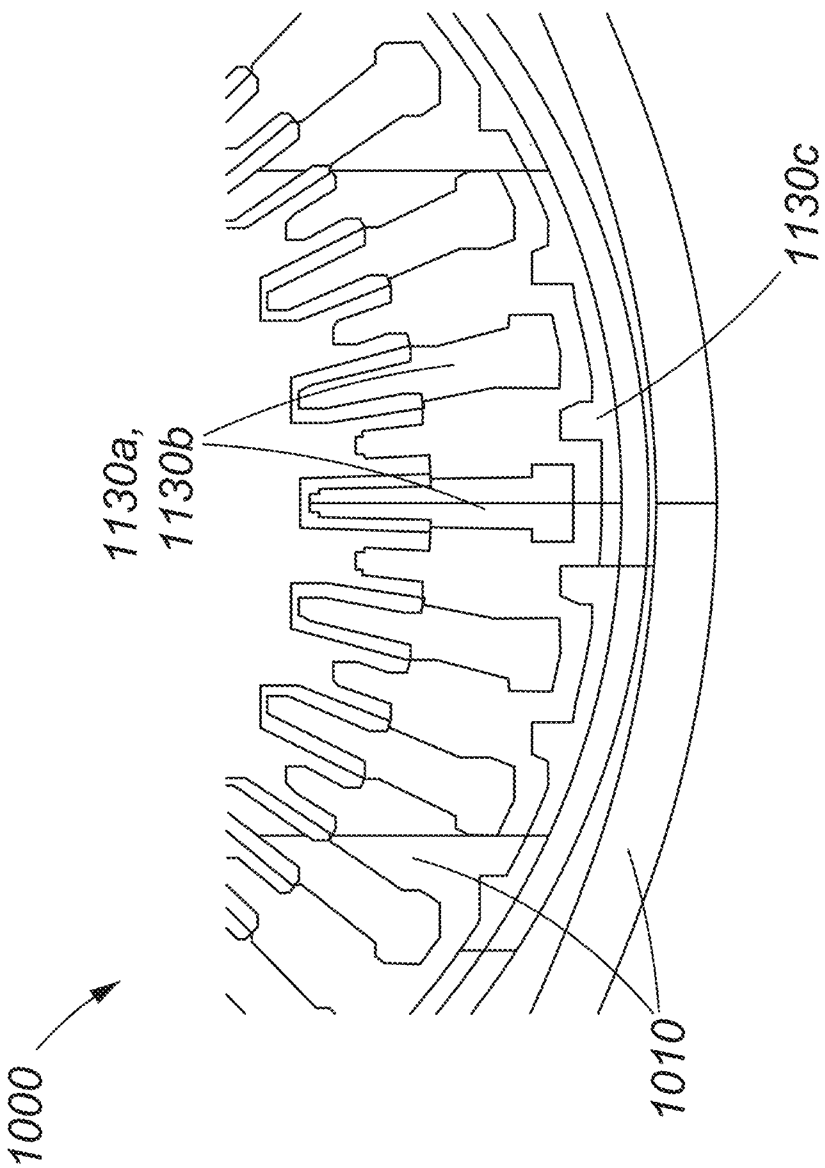
FIG. 13*b* shows only the doping masks employed for p-type implants in FIG. 13*a*.
Figure 13C:
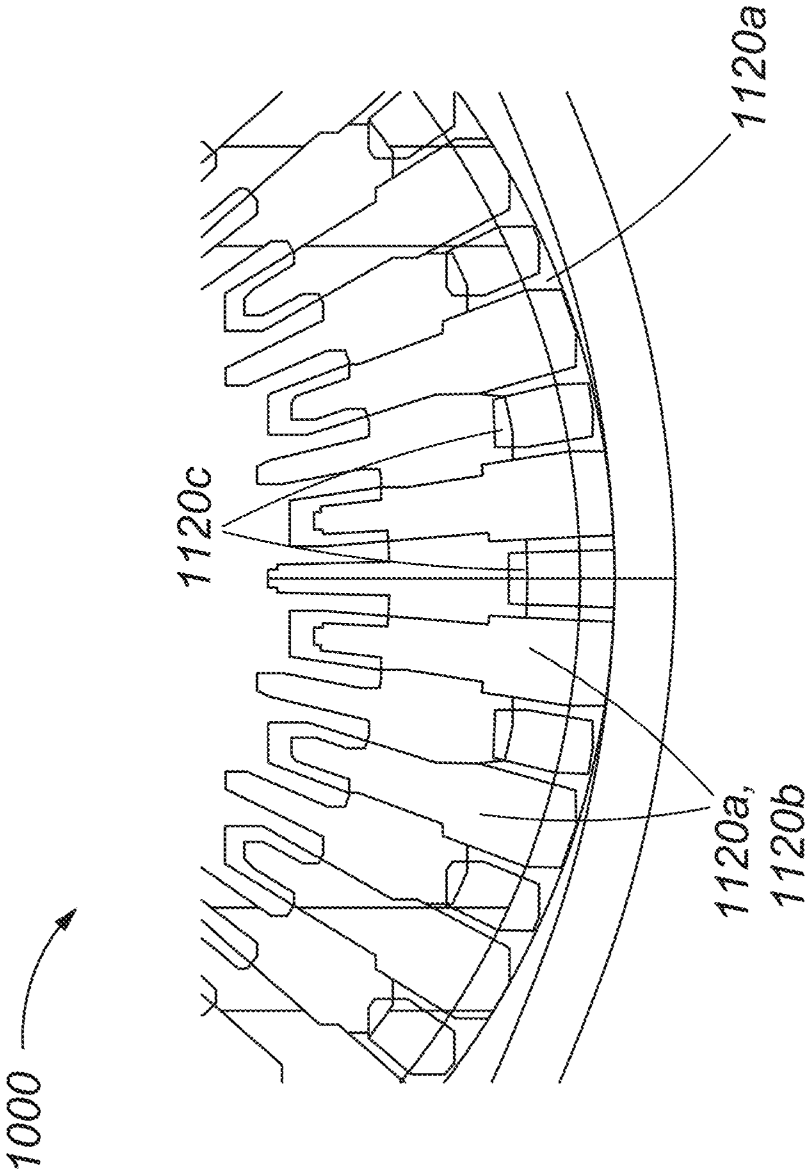
FIG. 13*c* shows only the doping masks employed for n-type implants in FIG. 13*a*.

Since there are several ion-implant masks present in advanced CMOS nodes (typically between 3 to 15 masks for each n-type or p-type doping), a variety of different mask pattern combinations can be used for doped silicon regions. For example, with reference to FIGS. 13*a*-13*c*, in one embodiment three n-type implants (1120*a*, 1120*b*, and 1120*c*, which are collectively referred to as n-implants 1120) and three p-type implants (1130*a*, 1130*b*, and 1130*c*, which are collectively referred to as p-implants 1130) are employed for the clove-shaped well-implant regions and corresponding counter implants. More specifically, the respective dosages of the six different implantations and the shape of the masks are tuned so as to achieve small resistances between the SiGe region 1150 and the electrical contacts 1190 located on the inner radius, but also to reduce the free-carrier absorption loss (and therefore small free-carrier densities where the optical mode of radiation is concentrated) and effective voltage gradients for creating the drift in the generated photocarriers. Multiple implants may therefore be used in the narrow clove region connecting the SiGe region 1150 to the metal electrodes 1190, while counter-implants are used on the outer radius, as shown in FIGS. 13*a*-13*c*. FIG. 13*a* shows all doping masks superimposed together (three masks for n-type implants and three masks for p-type implants), FIG. 13*b* shows only the p-type implants 1130, and FIG. 13*c* shows only the n-type implants 1120. By using counter implants it is possible to obtain almost arbitrary doping profiles since feature sizes smaller than the minimum feature sizes of the individual masks can be obtained. For example, by using two masks having a feature size of, e.g., 120 nm and 100 nm, it is possible to obtain minimum feature dimensions of only 10 nm (alignment tolerances are neglected in this example).

Figure 14A:
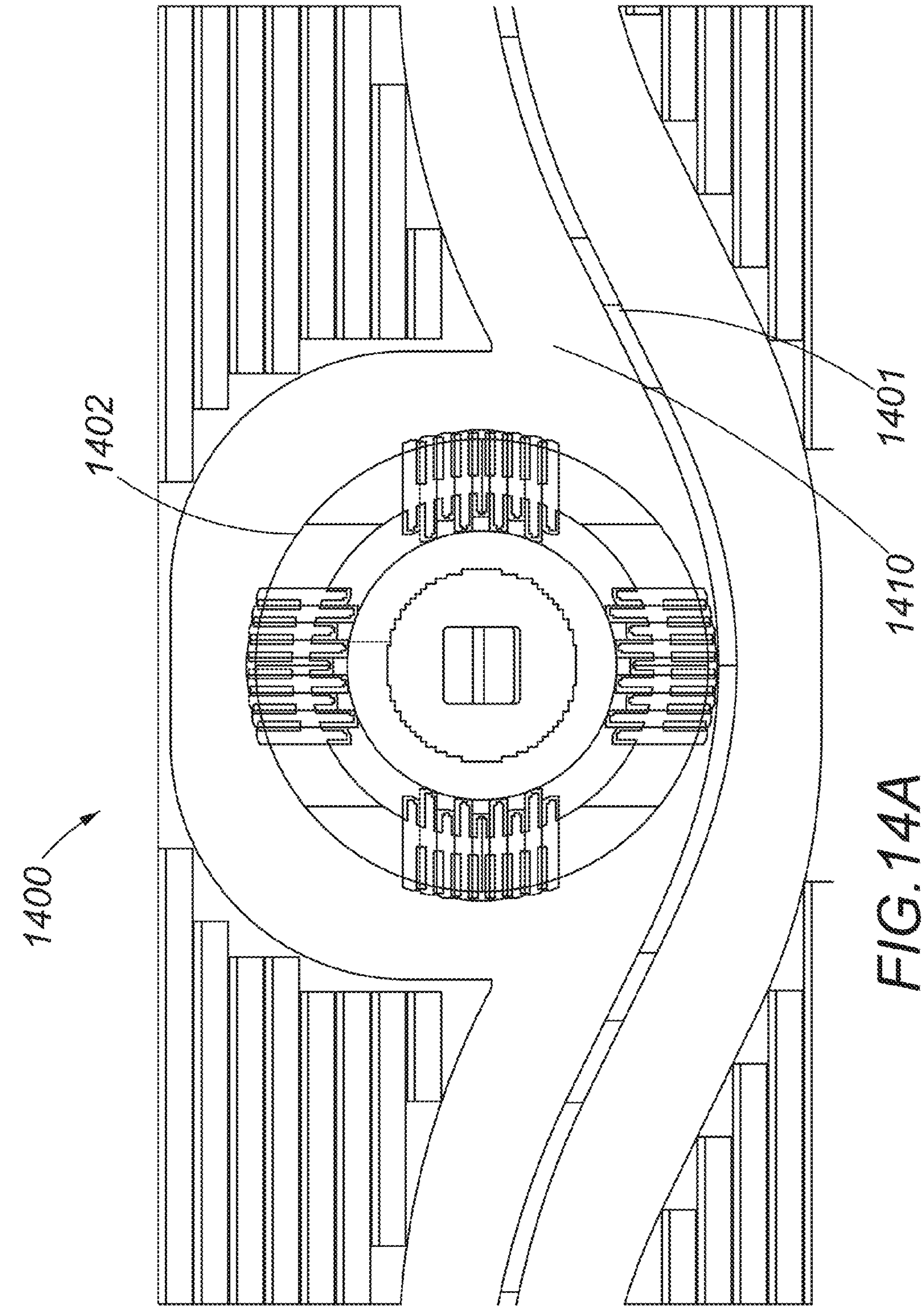
FIGS. 14*a*-14*d* show various aspects of feature layout for a closed-loop resonator waveguide-coupled photodetector apparatus according to another inventive embodiment.
Figure 14B:
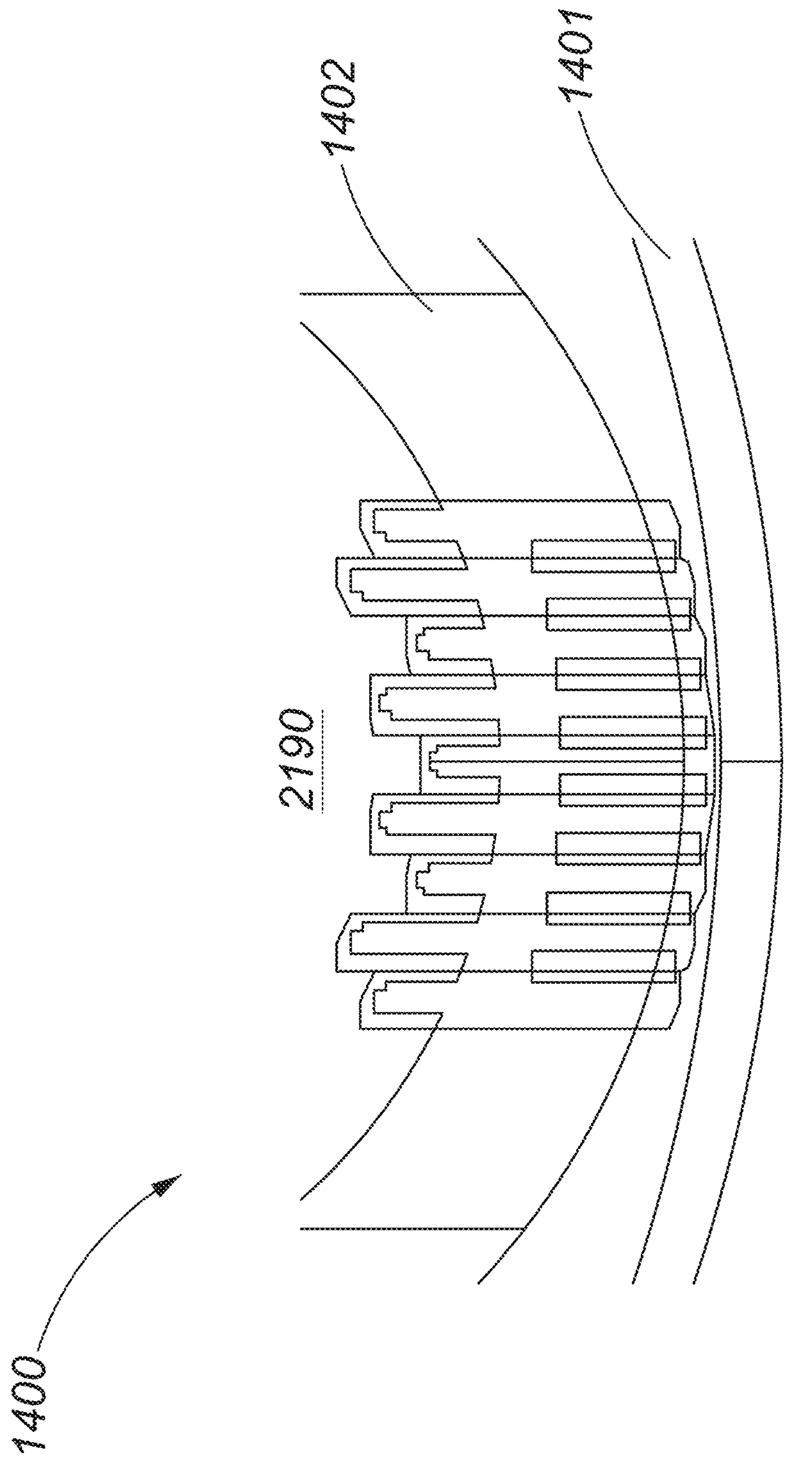
Figure 14C:
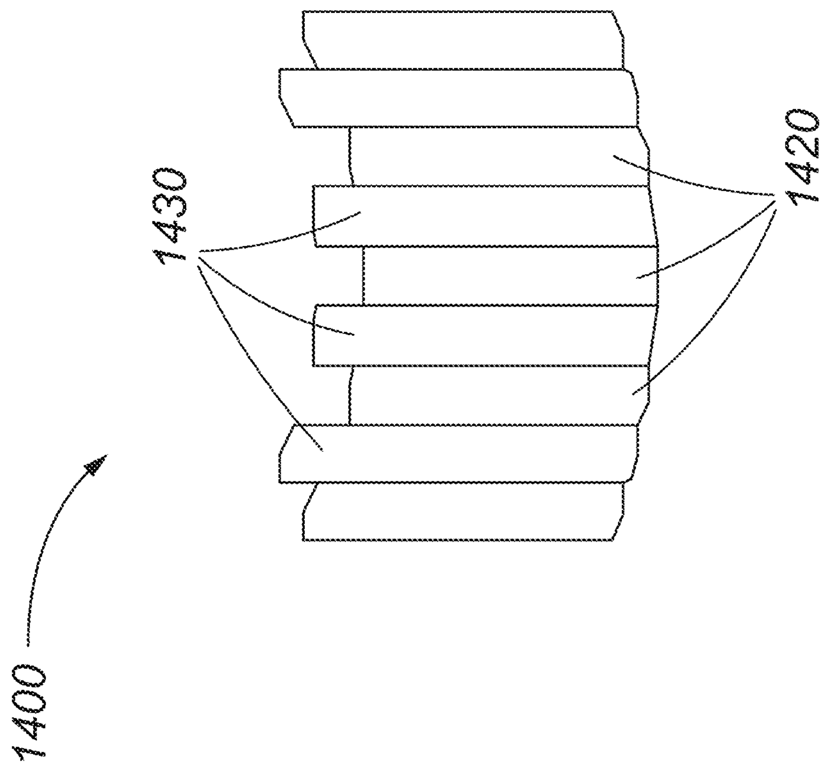
Figure 14D:
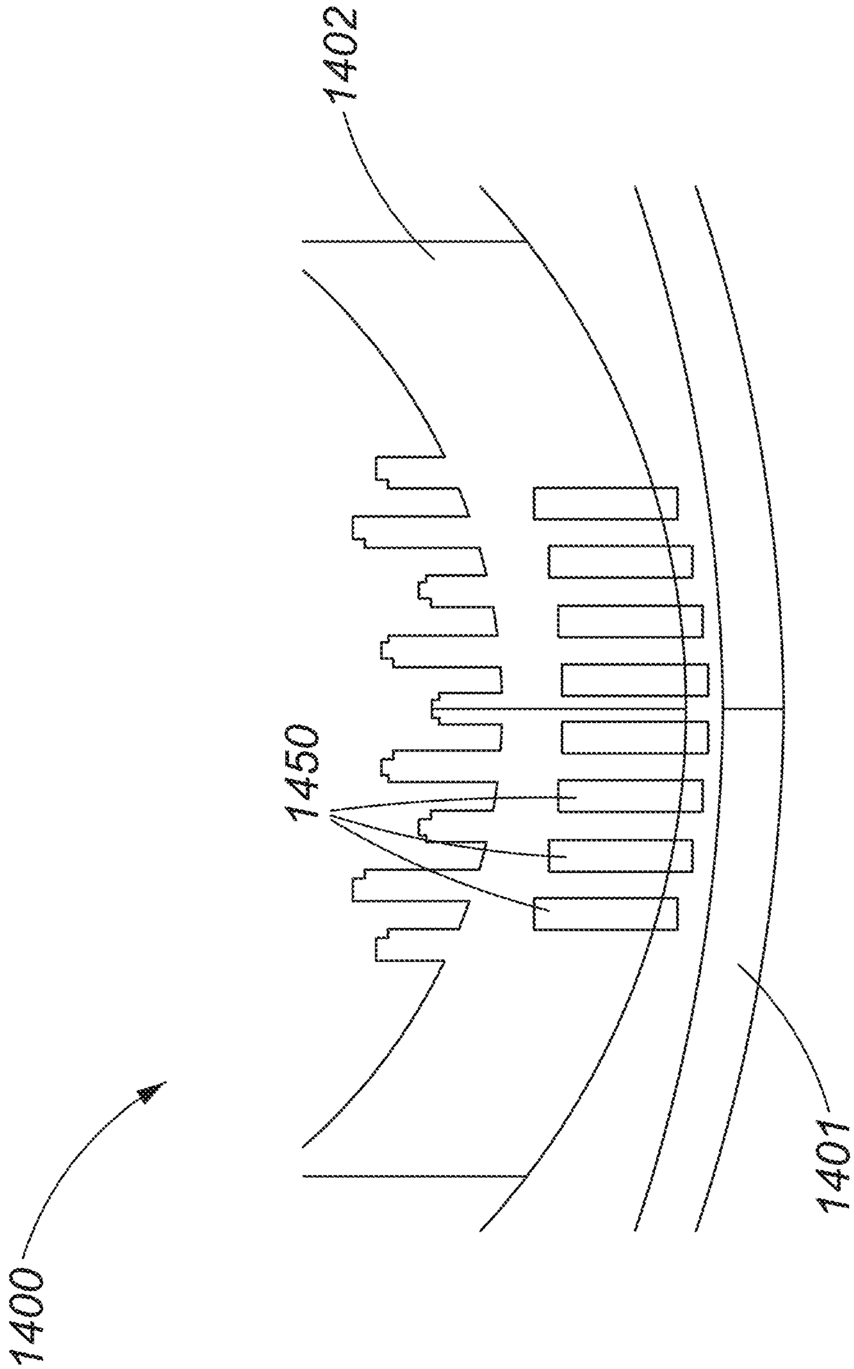

FIGS. 14*a*-14*d* show various aspects of feature layout for a closed-loop resonator waveguide-coupled photodetector apparatus according to another inventive embodiment. In this embodiment, the photodetector apparatus includes a silicon resonator structure (e.g., in the shape of a ring), and four portions of the ring structure (e.g., at the top, bottom, left and right portions), each of which portions includes multiple n-type and p-type well-implant regions and multiple SiGe regions aligned along a silicon crystallographic axis. For example, FIG. 14*a* shows a full device fabricated with Si—Ge regions oriented along the [100] axis (e.g., in the top and bottom portions of the resonator structure) and along the [010] axis (e.g., in the left and right portions of the resonator structure). FIG. 14*b* shows a zoomed-in view of the bottom portion of the resonator structure of FIG. 14*a*, FIG. 14*c* shows the alternating n-type and p-type well-implant regions in this bottom portion, and FIG. 14*d* shows a portion of the silicon resonator structure and multiple vertically-oriented strips of SiGe regions along one of the crystallographic axis.

More specifically, the SiGe photodetector apparatus 1400 shown in the embodiment of FIGS. 14*a*-14*d*, includes multiple silicon-germanium strips 1450 aligned with one of the main silicon crystallographic axes (e.g., along the [100] and [010] directions) of the underlying crystalline silicon 1410, formed in respective portions of the silicon resonator structure (e.g., ring cavity) 1402. This design retains an access waveguide 1401 to couple in incident light. FIG. 14*b* shows a zoomed-in view of a portion of the SiGe photodetector 1400. FIG. 14*c* shows only the n-implants 1420 and p-implants 1430 and FIG. 14*d* shows placements of the SiGe strips 1450 on the ring cavity 1402 and the access waveguide 1401.

Returning attention to the photodetector apparatus discussed above in connection with FIGS. 11*a*, 11*b*, and 11*c*, FIGS. 15*a* and 15*b* show plots of various parameters representing aspects of photodetector apparatus performance. For example, FIG. 15*a* shows a plot of current vs. bias voltage for different illumination conditions, and FIG. 15*b* shows a plot of responsivity as a function of incident wavelength.

Figure 15A:
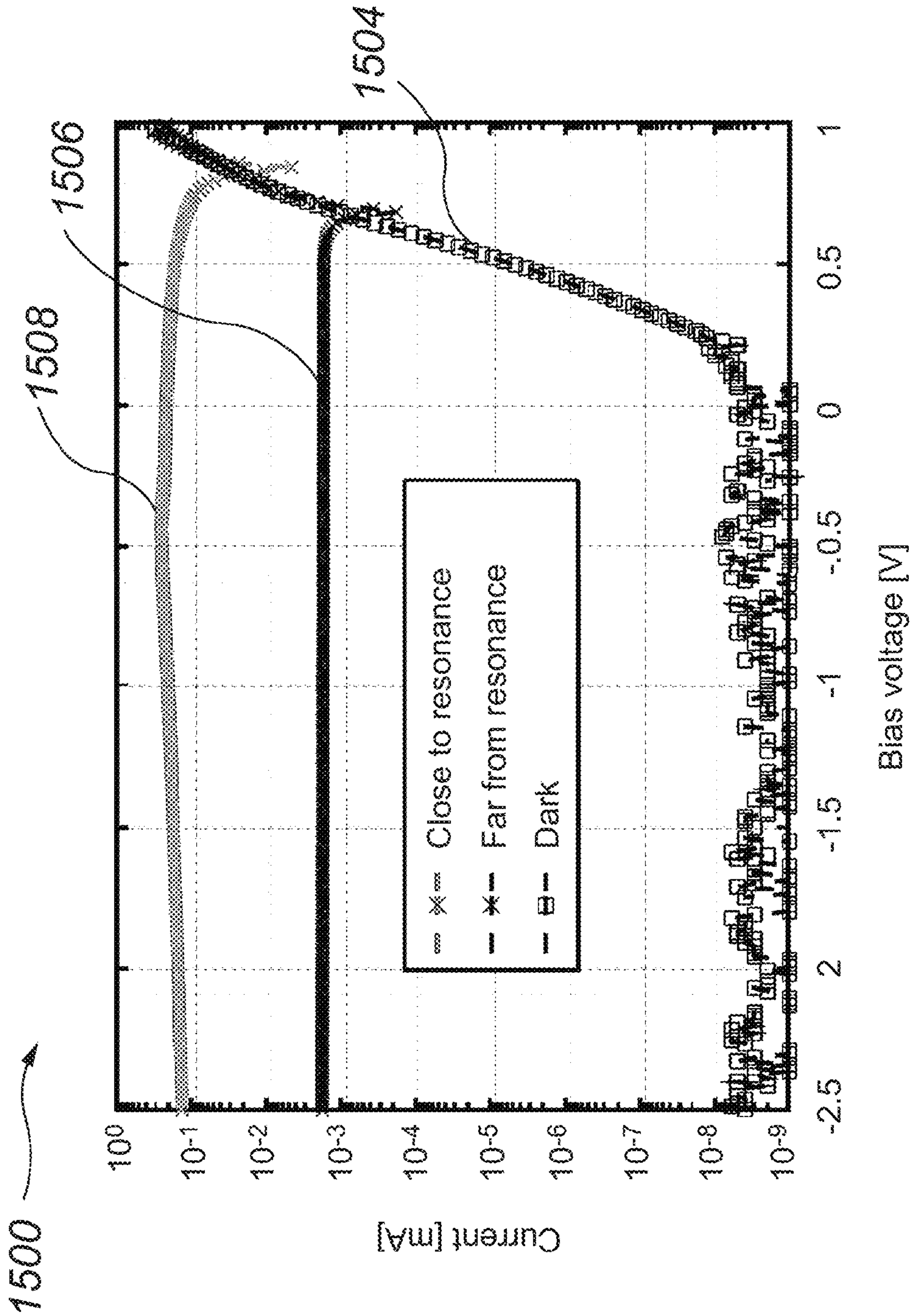
FIG. 15*a* shows a plot of current vs. bias voltage of the photodetector apparatus of FIGS. 11*a*, 11*b* and 11*c* for different illumination conditions.

As shown in FIG. 15*a*, the dark-current 1504 of the device is less than 10 pA in reverse-bias conditions (−2.5 V-0 V), which translates to a dynamic range of more than 70 dB. For wavelengths far from the resonance, the photocurrent 1506 is approximately constant ($V_{bias}<0$) and even with the reverse bias voltages. For high optical powers and wavelengths close to resonance, the photocurrent 1508 is not constant for negative bias voltages. For example, as the device is driven to resonance, self-heating and shifts of the resonant wavelength affect the current output to change as the bias voltage changes. This effect can be attributed to variations of the resonant frequency caused by plasma dispersion in the p-n junctions and self-heating.

Figure 15B:
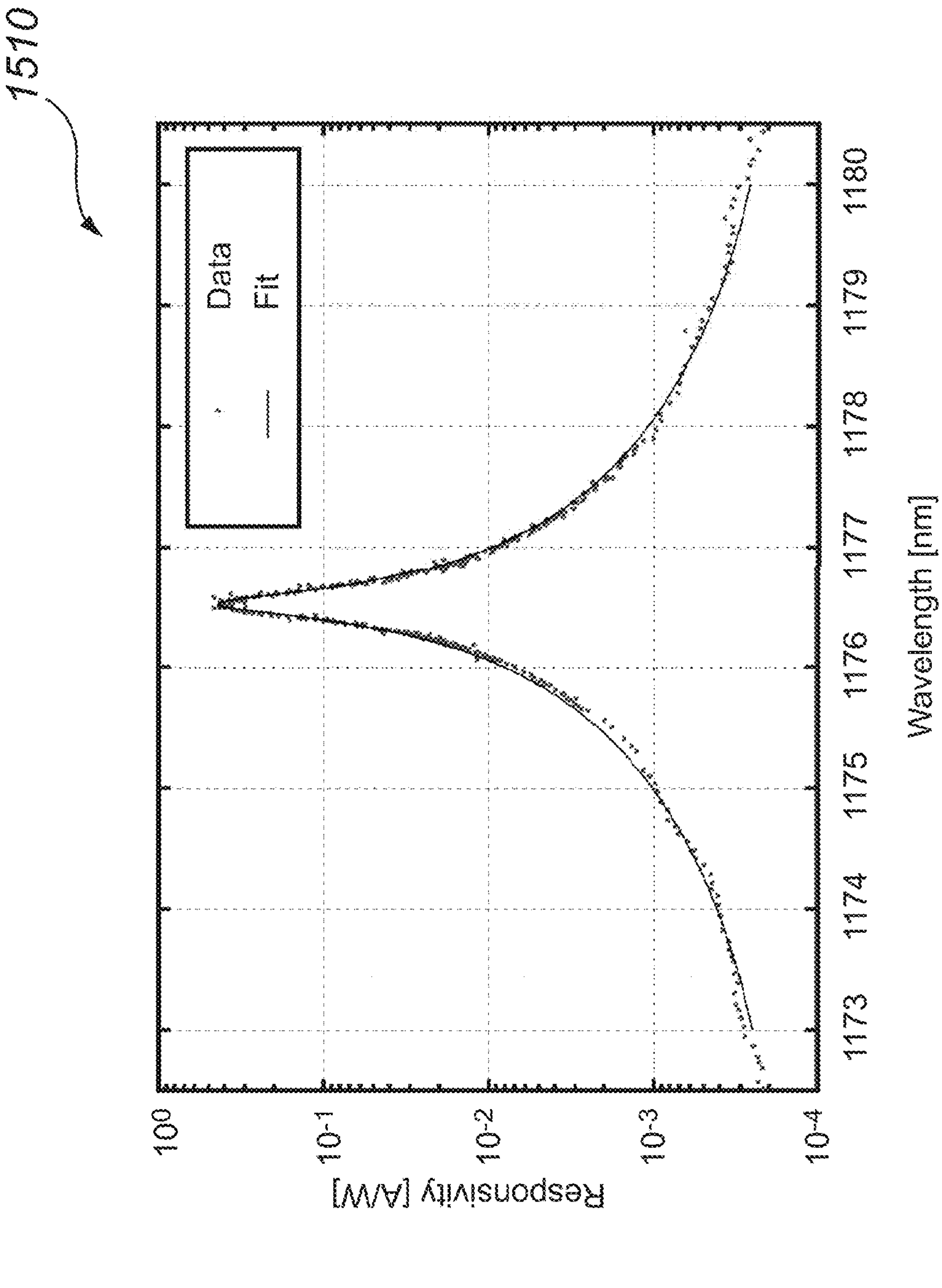
FIG. 15*b* shows a plot of responsivity of the photodetector apparatus of FIGS. 11*a*, 11*b* and 11*c* as a function of incident wavelength.

With respect to FIG. 15*b*, the internal responsivity 1510 of the device (optical power at the input access waveguide/photocurrent) is measured as a function of wavelength by recording at the same time input optical power, output optical power and photocurrent. As shown in FIG. 15*b*, at the wavelength of 1176.5 nm the responsivity is of 0.44±0.05 A/W (0V bias).

Figure 16A:
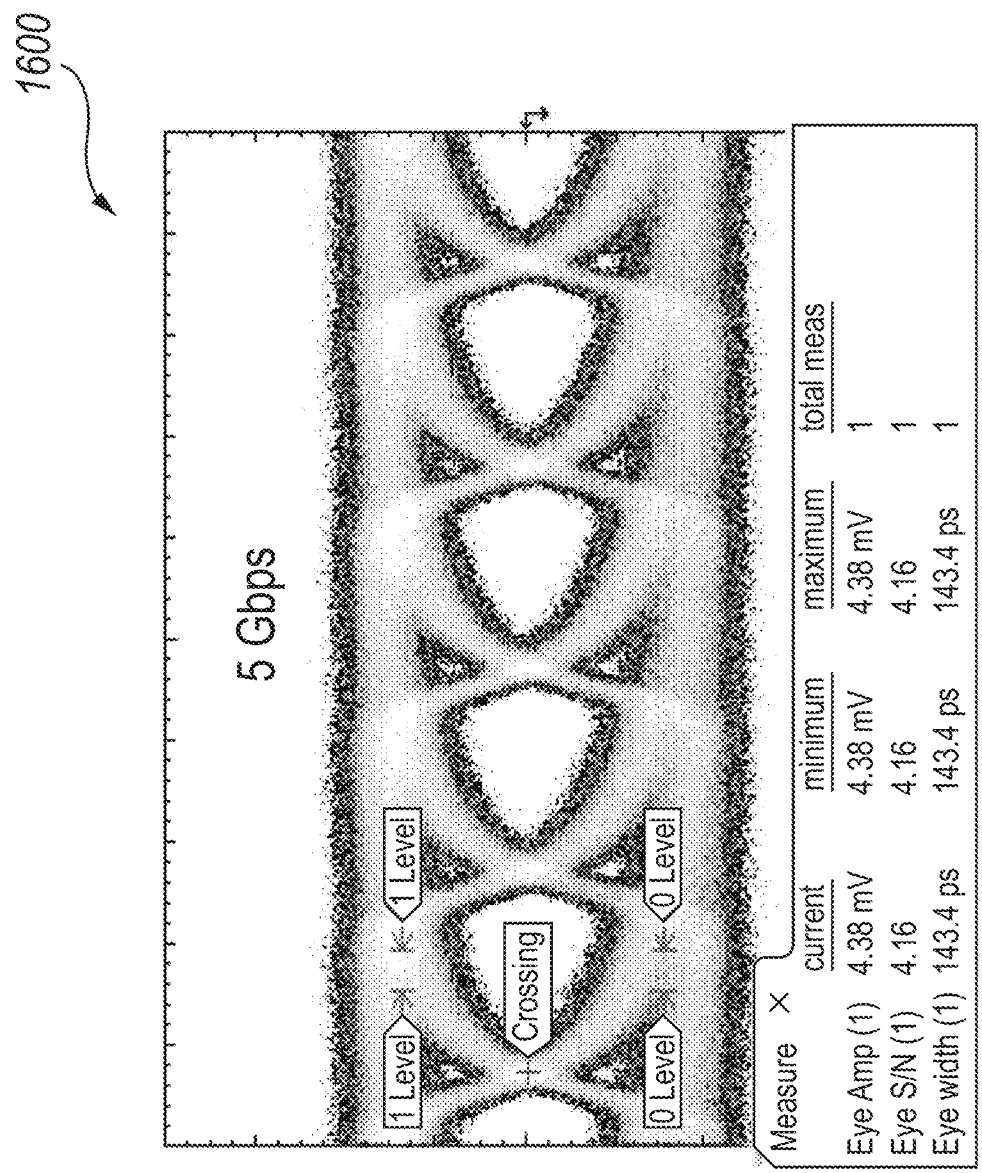
FIG. 16*a* is an eye diagram for the photodetector apparatus of FIGS. 11*a*, 11*b* and 11*c* at 5 Gbps and −2.5 V bias.
Figure 16B:
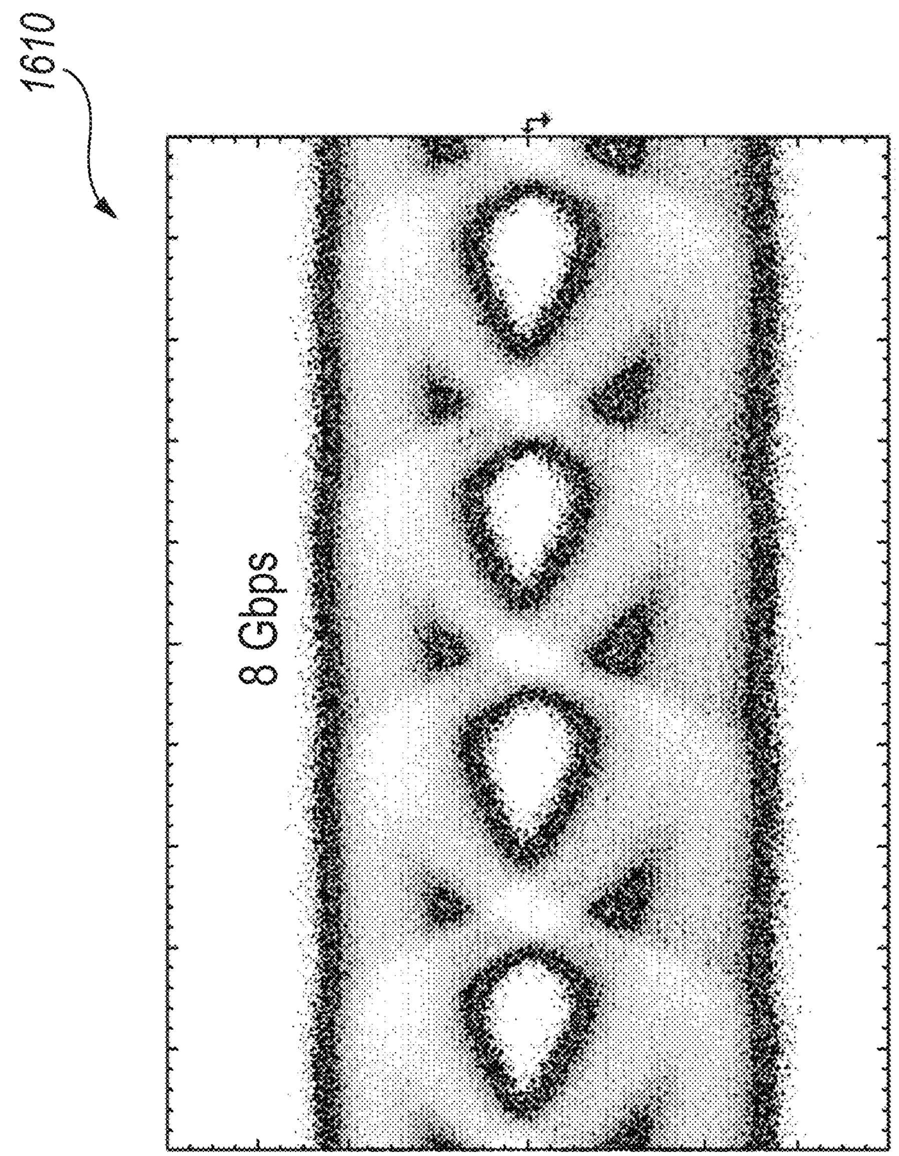
FIG. 16*b* is an eye diagram for the photodetector apparatus of FIGS. 11*a*, 11*b* and 11*c* at 8 Gbps and −2.5 V bias.
Figure 16C:
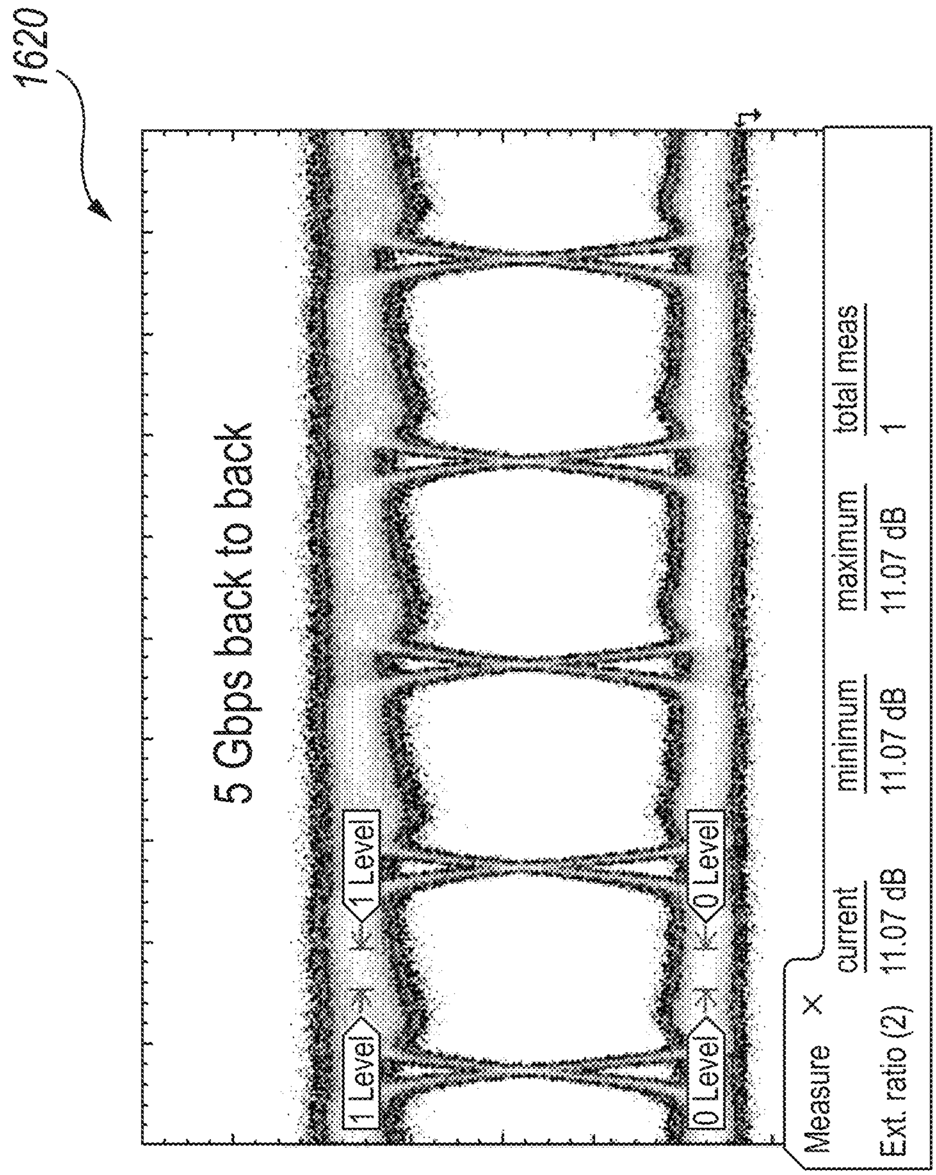
FIG. 16*c* is a reference eye diagram of a conventional 30 GHz commercial photodiode taken at 5 Gbps.

Additionally, "eye diagrams" were measured at 5 Gbps, 8 Gbps, and 5 Gbps back-to-back (PRBS length $2^{31}-1$) with a waveform analyzer (Agilent 86108A with 50 ohm termination), as shown in the performance plots 1600, 1610, and 1620, respectively in FIGS. 16*a*, 16*b*, and 16*c*. In these measurements, neither optical nor electrical amplifiers were used. The average in-fiber power before entering the device under test was about 3.8 dBm. An approximately 90 μA of generated photocurrent is sufficient for driving the on-chip electrical receivers (present at a different location) which has a sensitivity of 6 μA at 5 Gb/s. The free spectral range (FSR) is 13.75 nm and the transmission at resonance is −8 dB. The scale is 1.5 mV/div for all diagrams.

The technology as described herein demonstrates the first high-responsivity waveguide-coupled photodetectors fabricated as zero-change CMOS photonic devices, based on linear and closed-loop resonator architectures. Exemplary closed-loop resonator photodetector apparatuses demonstrated a responsivity of 0.44 A/W at 0 V bias. Resonant architectures enable improved quantum efficiencies due to longer effective path lengths, smaller dimensions, and wavelength selectivity of the resonator architectures facilitate sensing systems based on wavelength-division multiplexing (WDM).

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A photodetector apparatus, comprising:

a silicon substrate;

a first plurality of n-doped well-implant regions formed in the silicon substrate;

a second plurality of p-doped well-implant regions formed in the silicon substrate and interdigitated with the first plurality of n-doped well-implant regions so as to form a plurality of silicon p-n junctions; and a curved-shape Silicon Germanium (SiGe) region formed within both the first plurality of n-doped well-implant regions and the second plurality of p-doped well-implant regions such that the plurality of p-n junctions are contiguous with the curved-shaped SiGe region.

2. The apparatus of claim 1, wherein a cross-sectional width of the SiGe region is less than or equal to 500 nanometers.

3. The apparatus of claim 1, wherein the SiGe region is p-doped and has a germanium content of 25 to 35 atomic percent.

4. The apparatus of claim 1, further comprising a silicon closed-loop structure formed in the silicon substrate to provide a resonator for an optical mode of radiation, wherein:

the first plurality of n-doped well-implant regions and the second plurality of p-doped well-implant regions are formed as a plurality of interdigitated spokes around the silicon closed-loop structure.

5. The apparatus of claim 4, wherein the silicon closed-loop structure is one of an ellipsis, a race track, and a ring.

6. The apparatus of claim 4, wherein the SiGe region is located in the silicon closed-loop structure so as to substantially overlap with the optical mode of radiation when present in the silicon ring so as to generate photocarriers in the SiGe region.

7. The apparatus of claim 4, wherein:

the silicon closed-loop structure is a silicon ring structure;

a cross-sectional width of the SiGe region is less than or equal to approximately 500 nanometers;

an outer radius of the silicon ring structure is approximately 5 micrometers; and the SiGe region is disposed about 300 nanometers from the outer radius of, and within, the silicon ring structure.

8. The apparatus of claim 4, further comprising:

a first electrode electrically coupled to the first plurality of n-doped well-implant regions; and a second electrode electrically coupled to the second plurality of p-doped well-implant regions.

9. The apparatus of claim 4, wherein each of the n-doped well-implant regions and the p-doped well-implant regions is shaped as a clove so as to reduce a parasitic capacitance associated with the plurality of p-n junctions, wherein a first end of the clove closest to an outer radius of the silicon ring structure has a larger width than a second end of the clove closest to an inner radius of the silicon ring structure.

10. The apparatus of claim 9, wherein at least some of the n-doped and p-doped well-implant regions include a higher-dose doping in the second end of the clove to reduce a resistance of the well-implant regions.

11. The apparatus of claim 10, further comprising a plurality of counter implants respectively disposed adjacent to the first end of each clove closest to the outer radius of the silicon ring so as to reduce free-carrier absorption loss in the resonator.

12. A waveguide-coupled closed-loop resonator Silicon Germanium (SiGe) photodetector apparatus, comprising:

a silicon closed-loop optical resonator structure to support an optical mode of radiation;

a plurality of p-n silicon junctions formed in the silicon resonator structure by a first plurality of n-doped silicon regions and a second plurality of p-doped silicon regions; and a curved-shaped closed-loop SiGe pocket formed in the silicon resonator structure and traversing the plurality of p-n silicon junctions, wherein the SiGe pocket is disposed with respect to the silicon resonator structure such that the optical mode of radiation, when present, overlaps with the SiGe pocket to generate photocarriers in the SiGe pocket.

13. The apparatus of claim 12, further comprising:

a first electric contact coupled to the first plurality of n-doped silicon regions and a second electric contact coupled to the second plurality of p-doped silicon regions, wherein the SiGe pocket is disposed with respect to the plurality of p-n silicon junctions such that respective electric fields arising from the plurality of p-n silicon junctions significantly facilitate a flow of the generated photocarriers between the first electric contact and the second electric contact.

14. The apparatus of claim 13, wherein the SiGe pocket is p-doped and has a germanium content of 25 to 35 atomic percent.

15. The apparatus of claim 13, wherein the first plurality of n-doped silicon regions and the second plurality of p-doped silicon regions are formed as a plurality of interdigitated spokes around the silicon resonator structure.

16. The apparatus of claim 13, wherein the silicon closed-loop structure is one of an ellipsis, a race track, and a ring.

17. The apparatus of claim 13, wherein each of the n-doped silicon regions and the p-doped silicon regions is shaped as a clove so as to reduce a parasitic capacitance associated with the plurality of p-n junctions, and wherein a first end of the clove closest to an outer dimension of the silicon resonator structure has a larger width than a second end of the clove closest to an inner dimension of the silicon resonator structure.

18. The apparatus of claim 17, wherein at least some of the n-doped and p-doped silicon regions include a higher-dose doping in the second end of the clove to reduce a resistance of the well-implant regions.

19. The apparatus of claim 18, further comprising a plurality of counter implants respectively disposed adjacent to the first end of each clove closest to the outer dimension of the silicon resonator structure so as to reduce free-carrier absorption loss in the silicon resonator structure.

20. The apparatus of claim 12, formed by a photodetector fabrication method, comprising:

A) using a zero-change Complimentary Metal-Oxide Semiconductor (CMOS) fabrication process technology to form the waveguide-coupled closed-loop resonator photodetector having the curved-shaped closed-loop Silicon-Germanium (SiGe), the first plurality of n-doped silicon regions, and the second plurality of p-doped silicon regions.

21. The method of claim 20, wherein the zero-change CMOS fabrication process technology is a 45 nanometer 12SOI silicon-on-insulator (SOI) CMOS process technology.

22. The method of claim 20, wherein A) comprises:

A1) forming the first plurality of n-doped silicon regions in a silicon substrate using at least one first conventional n-well layer of the CMOS fabrication process technology;

A2) forming the second plurality of p-doped silicon regions in the silicon substrate, and interdigitated with the first plurality of n-doped silicon regions, using at least one second conventional p-well layer of the CMOS fabrication process technology so as to form the plurality of p-n junctions;

A3) forming the curved-shaped pocket in the first plurality of n-doped silicon well-implant regions and the second plurality of p-doped silicon well-implant regions; and A4) epitaxially growing the curved-shaped SiGe pocket, using a conventional PFET strain engineering layer of the CMOS fabrication process technology, such that the SiGe pocket traverses the plurality of p-n junctions.

* * * * *